US011118265B2

(12) United States Patent
Ozaki et al.

(10) Patent No.: US 11,118,265 B2
(45) Date of Patent: Sep. 14, 2021

(54) FILM DEPOSITION METHOD AND COMPUTER PROGRAM STORAGE MEDIUM

(71) Applicant: Tokyo Electron Limited, Tokyo (JP)

(72) Inventors: Shigenori Ozaki, Yamanashi (JP); Hitoshi Kato, Iwate (JP); Takeshi Kumagai, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 582 days.

(21) Appl. No.: 15/811,919

(22) Filed: Nov. 14, 2017

(65) Prior Publication Data
US 2018/0080123 A1 Mar. 22, 2018

Related U.S. Application Data

(62) Division of application No. 13/216,350, filed on Aug. 24, 2011, now abandoned.

(30) Foreign Application Priority Data

Aug. 27, 2010 (JP) .................................. 2010-191247

(51) Int. Cl.
C23C 16/455 (2006.01)
C23C 16/40 (2006.01)
(52) U.S. Cl.
CPC ...... C23C 16/45548 (2013.01); C23C 16/402 (2013.01); C23C 16/45536 (2013.01)

(58) Field of Classification Search
CPC .......... C23C 16/4554; C23C 16/45542; H01J 37/32266
See application file for complete search history.

(56) References Cited

U.S. PATENT DOCUMENTS

| 4,672,023 A | 6/1987 | Leung |
| 5,338,362 A | 8/1994 | Imahashi |
| 6,031,198 A | 2/2000 | Moriyama et al. |
| 6,869,641 B2 | 3/2005 | Schmitt |

(Continued)

FOREIGN PATENT DOCUMENTS

| JP | 3144664 | 3/2001 |
| JP | 2007-247066 | 9/2007 |

(Continued)

Primary Examiner — Parviz Hassanzadeh
Assistant Examiner — Nathan K Ford
(74) Attorney, Agent, or Firm — IPUSA, PLLC

(57) ABSTRACT

A film deposition method includes steps of: placing a substrate in a substrate receiving area of a susceptor provided in a vacuum chamber; evacuating the vacuum chamber; alternately supplying plural kinds of reaction gases to the substrate in the substrate receiving area from corresponding reaction gas supplying parts thereby to form a thin film on the substrate; supplying plasma including a chemical component that reacts with second reaction gas adsorbed on the substrate from a plasma generation part to the substrate when the thin film is being formed, thereby to alter the thin film on the substrate; and changing plasma intensity of the plasma supplied to the substrate, at a predetermined point of time to a different plasma intensity of the plasma that is generated and supplied to the substrate by the plasma generation part before the predetermined point of time.

7 Claims, 27 Drawing Sheets

(56) References Cited

U.S. PATENT DOCUMENTS

| | | |
|---|---|---|
| 7,153,542 B2 | 12/2006 | Nguyen et al. |
| 2002/0043216 A1 | 4/2002 | Hwang et al. |
| 2002/0192394 A1 | 12/2002 | Ebe et al. |
| 2007/0218702 A1 | 9/2007 | Shimizu et al. |
| 2008/0193643 A1 | 8/2008 | Dip |
| 2008/0242116 A1 | 10/2008 | Clark |
| 2008/0286980 A1 | 11/2008 | Ishimaru |
| 2009/0181550 A1* | 7/2009 | Hasebe ............... C23C 16/4554 438/791 |
| 2009/0233425 A1 | 9/2009 | Furuno et al. |
| 2009/0324828 A1 | 12/2009 | Kato et al. |
| 2010/0055347 A1 | 3/2010 | Kato et al. |

FOREIGN PATENT DOCUMENTS

| | | |
|---|---|---|
| KR | 10-0268369 | 11/2000 |
| KR | 10-2009-0118951 | 11/2009 |
| TW | 201005802 | 2/2010 |
| WO | 2008/121463 | 10/2008 |

\* cited by examiner

FIG.12 {
FILM THICKNESS: 0 to 1 (nm)
PLASMA INTENSITY: 0
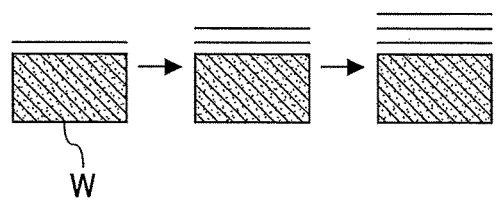
}
FIG.13 {
FILM THICKNESS: 1 to 2 (nm)
PLASMA INTENSITY: OXIDE FILM THICKNESS 1.5 nm (EQUIVALENT)
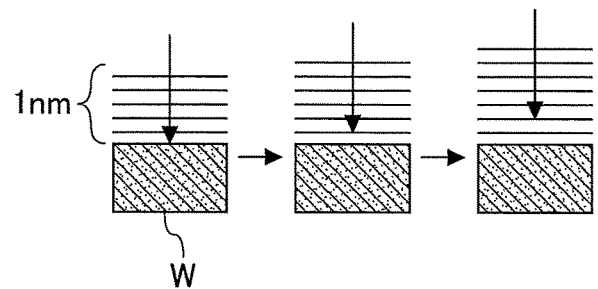
}
FIG.14 {
FILM THICKNESS: 2 to 10 (nm)
PLASMA INTENSITY: OXIDE FILM THICKNESS 3.7 nm (EQUIVALENT)
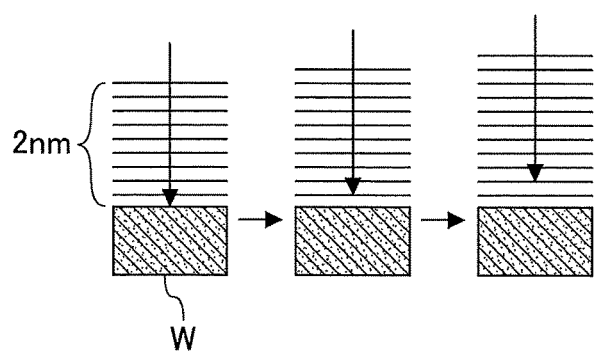
}

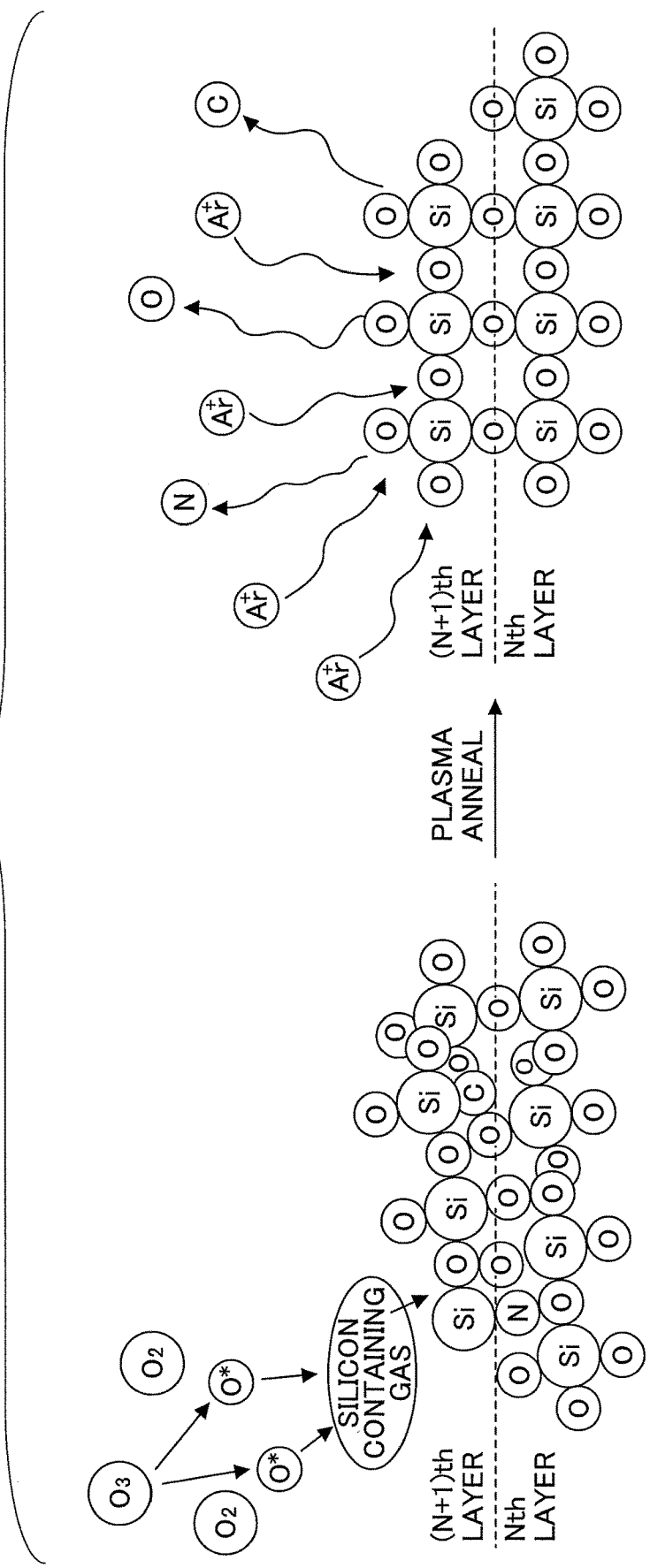

FILM THICKNESS: 0 to 3 (nm)
PLASMA INTENSITY: OXIDE FILM THICKNESS
             5.3 nm (EQUIVALENT)

FILM THICKNESS: 3 to 10 (nm)
PLASMA INTENSITY: OXIDE FILM THICKNESS
　　　　　　　　　3.7 nm (EQUIVALENT)

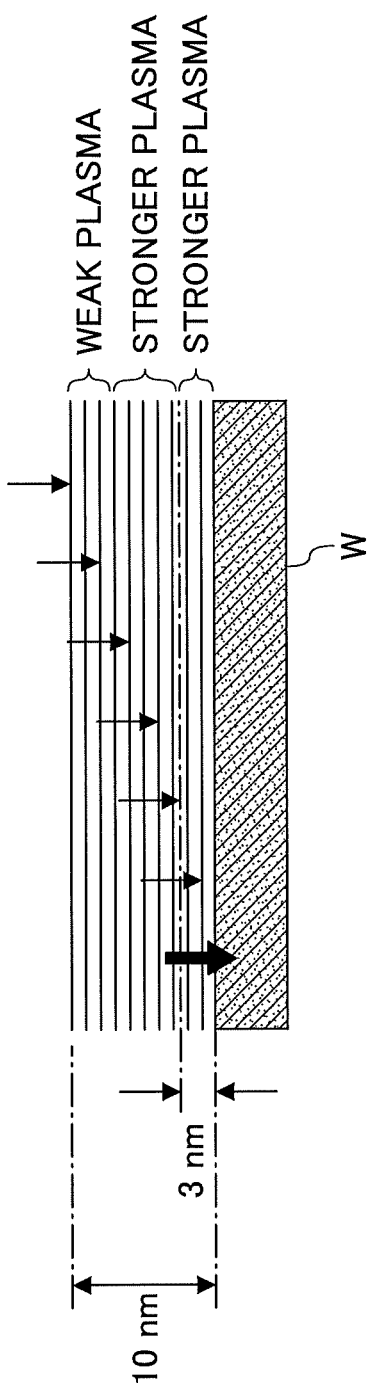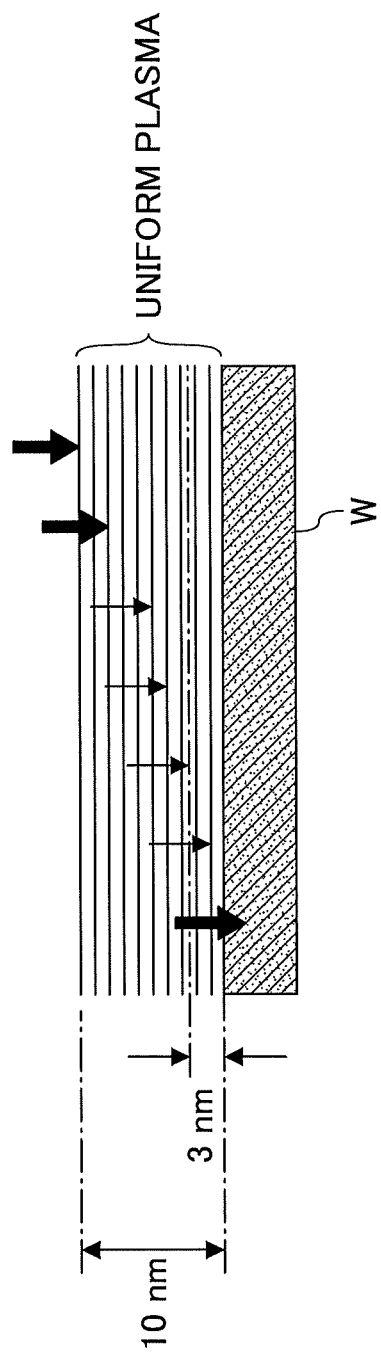

FILM DEPOSITION METHOD AND COMPUTER PROGRAM STORAGE MEDIUM

CROSS-REFERENCE TO RELATED APPLICATIONS

This is a divisional application of U.S. patent application Ser. No. 13/216,350, filed on Aug. 24, 2011, now abandoned, which is based upon and claims the benefit of priority of Japanese Patent Application No. 2010-191247, filed on Aug. 27, 2010 with the Japanese Patent. Office, the entire contents of which are hereby incorporated by reference.

BACKGROUND OF THE INVENTION

1. Field of the Invention

This invention relates to a film deposition apparatus and a film deposition method, where two or more kinds of reaction gases are alternately supplied to a surface of a substrate under vacuum, thereby to deposit a thin film on the substrate, and a storage medium that stores a computer program that causes the film deposition apparatus to perform the film deposition method.

2. Description of the Related Art

When, for example, a silicon oxide film is deposited on a substrate such as a semiconductor wafer made of silicon (referred to as a wafer hereinafter) having patterns including pillar-shaped or line-shaped convex portions formed on the surface of the wafer, a film deposition method called an Atomic Layer Film deposition (ALD) method or a Molecular Layer Film deposition (MLD) method may be used. Specifically, a thin film of silicon oxide is formed on the wafer by alternately supplying an organic material gas containing silicon and an oxidizing gas to the wafer under vacuum, thereby to accumulate an atomic layer or a molecular layer made of the reaction product. The thin film formed by such a film deposition method may have lower density because organic substances originating from the organic material gas remain in the thin film. This may be caused in part because a film deposition temperature of the film deposition method is relatively lower than that of a conventional Chemical Vapor Film deposition (CVD) method.

Then, densification of the thin film has been investigated by exposing the wafer to plasma of an alteration gas including oxygen ($O_2$), thereby to alter or densify the reaction product. However, when the thin film becomes thicker than a film thickness (or depth) through which the plasma can penetrate, a lower part of the thin film cannot be altered. On the other hand, when the thin film is thinner than the penetration depth, the plasma can reach an underlying layer of the thin film, so that an upper surface of the underlying layer made of, for example, silicon may be oxidized, as shown in FIG. 1. In this case, a width d of the convex portion may become smaller than designed, which makes it difficult to obtain desired electrical properties.

Incidentally, when the silicon oxide film to be used as a gate oxide film is formed by the CVD method or the ALD method, a boundary between the thin film and the silicon wafer may become less flat, which may lead to defects, compared to where the silicon oxide film is formed by a thermal oxidization process. Patent Documents below do not address such a problem, while describing the ALD method.

Patent Document 1: U.S. Pat. No. 7,153,542.
Patent Document 2: Japanese Patent Publication No. 3,144,664.
Patent Document 3: U.S. Pat. No. 6,869,641.

SUMMARY OF THE INVENTION

The present invention has been made in view of the above, and is directed to a technology that can yield a thin film having a sufficient density along a thickness direction when the thin film is deposited on a substrate by repeatedly alternately supplying plural kinds of gases to the substrate under vacuum. In addition, the present invention provides a technology contributing to fabrication of high-performance semiconductor devices.

According to a first embodiment of the present invention, there is provided a film deposition method that forms a thin film on a substrate by repeating a cycle of alternately supplying plural kinds of reaction gases to the substrate under vacuum, wherein a first reaction gas among the plural kinds of the reaction gases reacts with a second reaction gas among the plural kinds of the reaction gases, the second reaction gas being adsorbed on the substrate, thereby to produce a reaction product. The film deposition method includes steps of placing a substrate in a substrate receiving area of a susceptor provided in a vacuum chamber; evacuating the vacuum chamber; supplying the plural kinds of the reaction gases from corresponding reaction gas supplying parts toward the susceptor; supplying plasma including a chemical component that reacts with one of the second reaction gas adsorbed on the substrate and at least a part of the substrate from the plasma generation part toward the susceptor; and rotating the susceptor around a vertical axis so that the substrate receiving area passes alternately through a supplying area to which the second reaction gas is supplied, a reaction area where the first reaction gas reacts with the second reaction gas adsorbed on the substrate, and a plasma area that is arranged downstream relative to the reaction area along a rotation direction of the susceptor and where the plasma is supplied, wherein the supplying area, the reaction area, and the plasma area are arranged at intervals along a circumferential direction of the vacuum chamber.

BRIEF DESCRIPTION OF THE DRAWINGS

FIG. 12 is a schematic view illustrating a process flow;

FIG. 13 is another schematic view illustrating a process flow, following FIG. 12;

FIG. 14 is yet another schematic view illustrating a process flow, following FIG. 13;

FIG. 15 is a schematic view illustrating an alteration step performed in the film deposition apparatus;

FIG. 25 is an explanatory view for explaining a process according to another example of the present invention;

FIG. 26 is a schematic view illustrating another process according to another example of the present invention;

DETAILED DESCRIPTION OF THE PREFERRED EMBODIMENT

Figure 1:
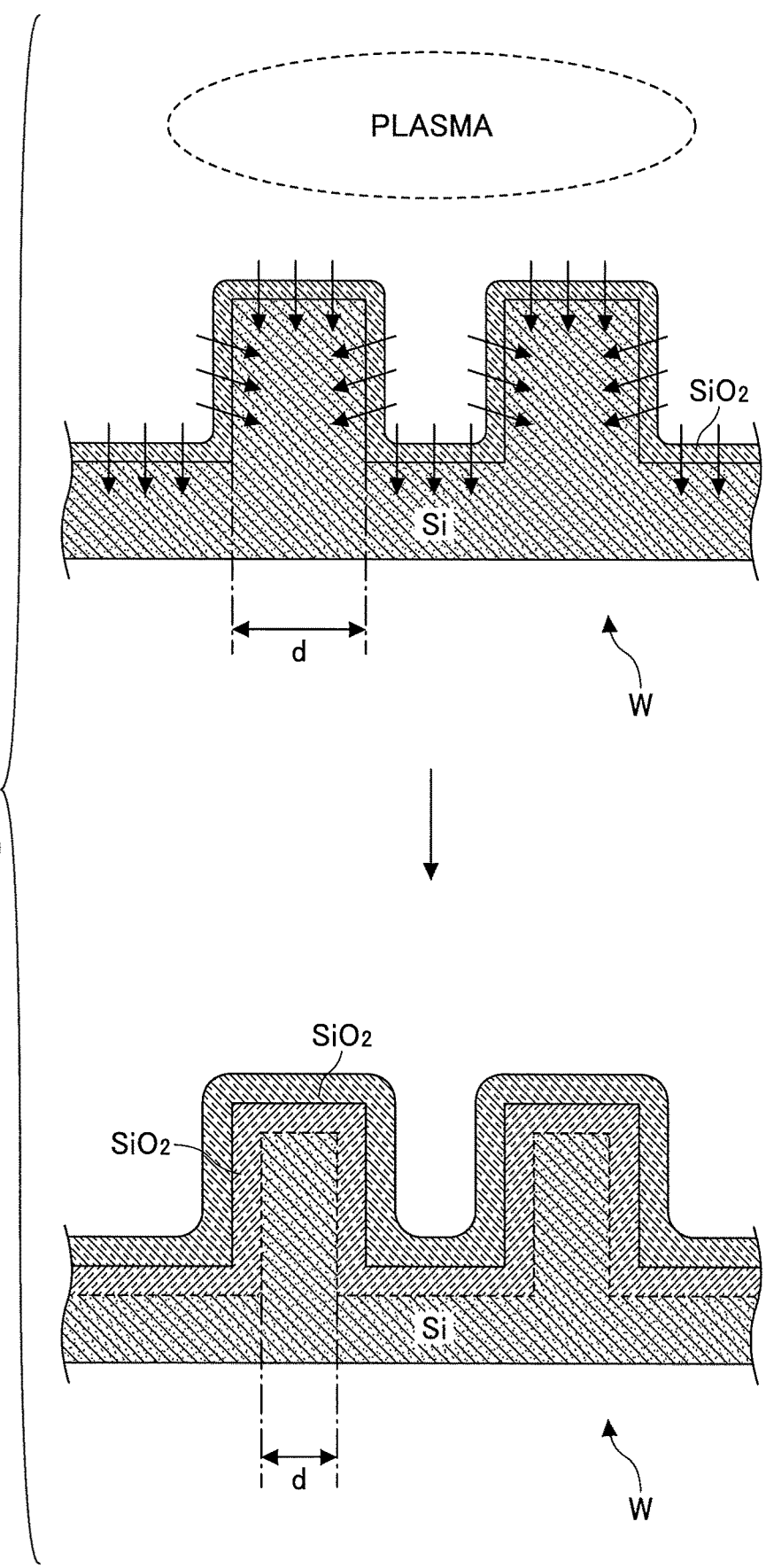
FIG. 1 is a schematic view illustrating a thin film obtained by a conventional method.

According to embodiments of the present invention, a thin film formed on a substrate by repeatedly alternately supplying plural kinds of gases to the substrate under vacuum can be sufficiently densified along a thickness direction, because an alteration step where the substrate is exposed to plasma during the film deposition is carried out. In addition, because plasma intensity of the plasma is changed during the film deposition, influence incurred on the underlying layer of the thin film by the plasma can be controlled, and properties of the thin film can be uniform along the thickness direction, thereby contributing to fabrication of high-performance semiconductor devices.

A First Embodiment

A film deposition apparatus according to a first embodiment of the present invention is explained referring to FIGS. 1 through 7. The film deposition apparatus has a vacuum chamber 1 having a flattened cylinder shape, and a turntable 2 that is located inside the chamber 1 and has a rotation center at a center of the vacuum chamber 1. The vacuum chamber 1 is made so that a ceiling plate 11 can be separated from a chamber body 12. The ceiling plate 11 is pressed onto the chamber body 12 via a sealing member such as an O ring 13, so that the vacuum chamber 1 is sealed in an airtight manner. On the other hand, the ceiling plate 11 can be raised by a driving mechanism (not shown) when the ceiling plate 11 has to be removed from the chamber body 12.

The turntable 2 is attached on a cylindrically shaped core portion 21. The core portion 21 is attached on a top end of a rotational shaft 22 that extends in a vertical direction. The rotational shaft 22 goes through a bottom portion 14 of the chamber body 12 and is attached at the lower end to a driving mechanism 23 that can rotate the rotational shaft 22 clockwise, in this embodiment. The rotational shaft 22 and the driving mechanism 23 are housed in a case body 20 having a cylinder with a bottom. The case body 20 is attached in an airtight manner to a bottom surface of the bottom portion 14 via a flange part, which maintains airtightness of an inner environment of the case body 20 from an outer environment.

Figure 2:
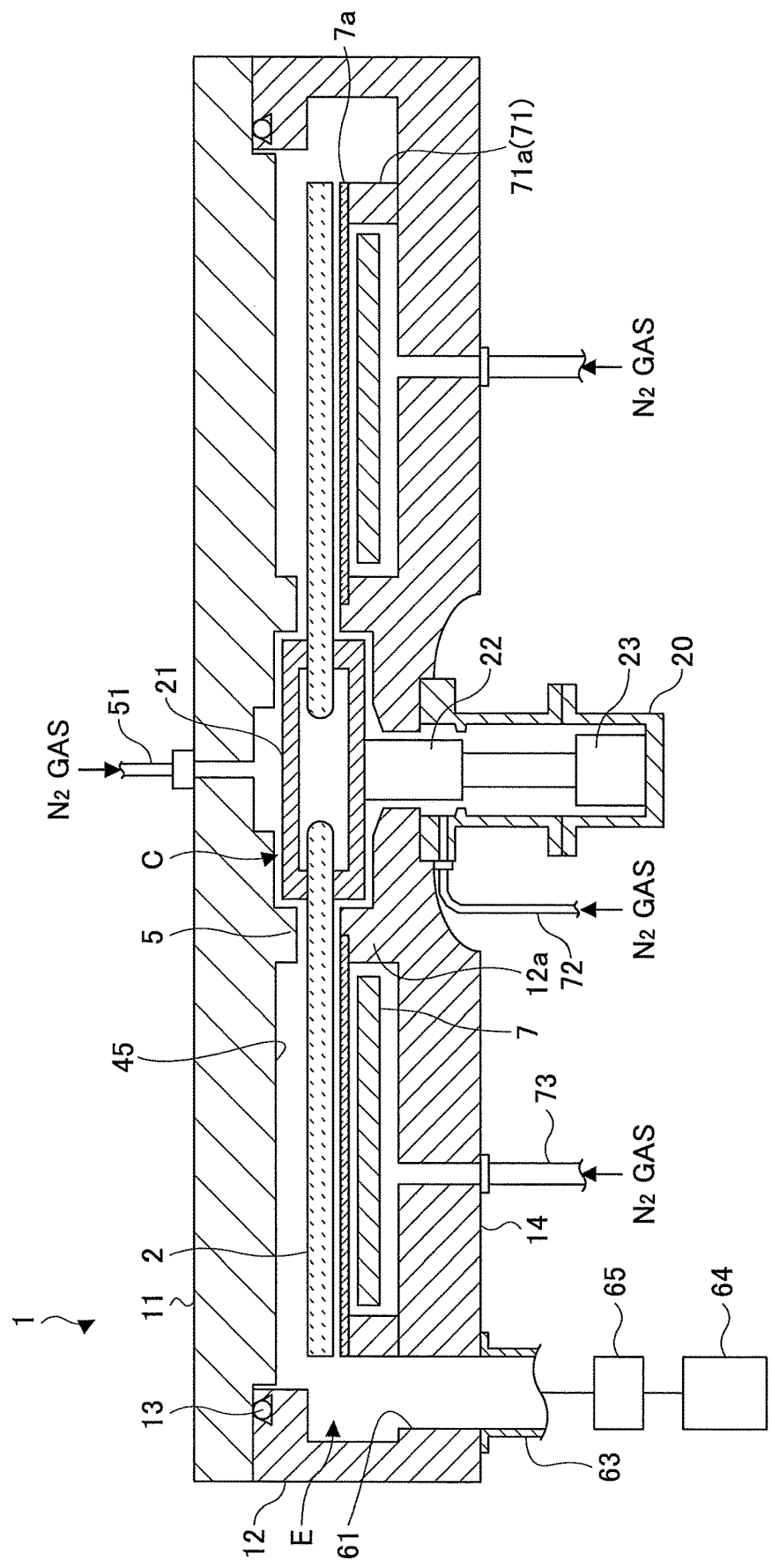
FIG. 2 is a cross-sectional view illustrating a film deposition apparatus according to an embodiment of the present invention, where the view is taken along I-I' line in FIG. 4.
Figure 3:
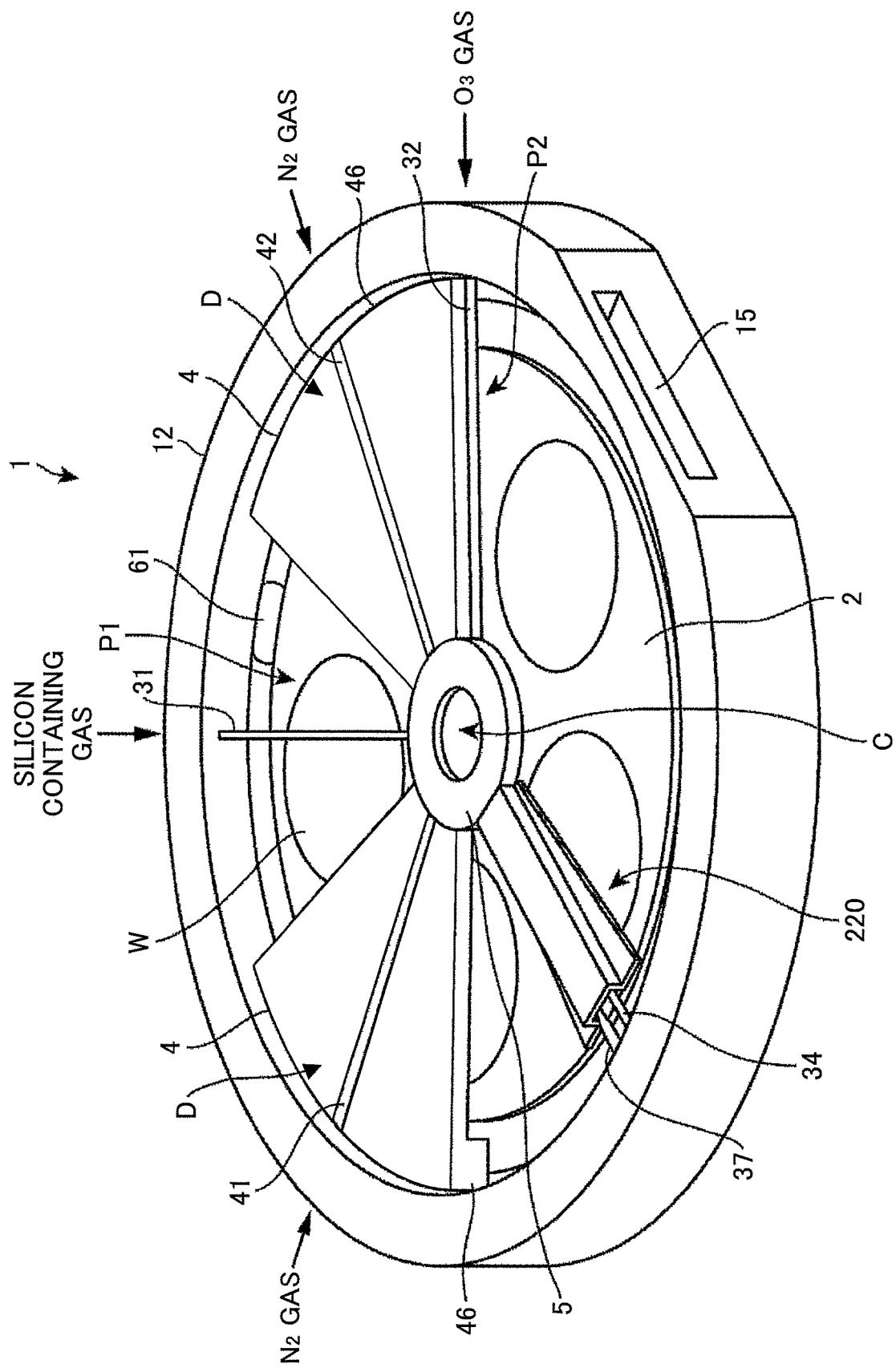
FIG. 3 is a perspective view illustrating an inner structure of the film deposition apparatus.
Figure 9:
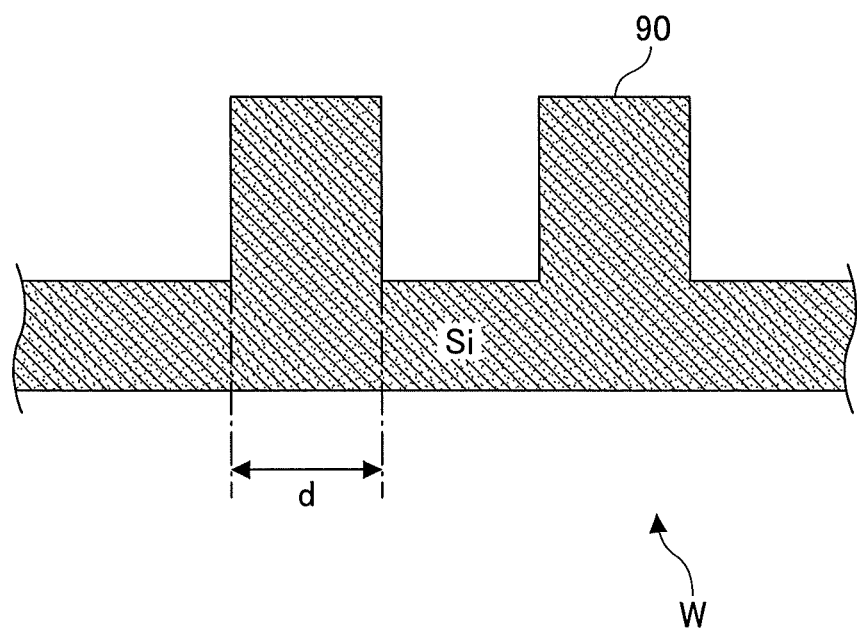
FIG. 9 is a cross-sectional view illustrating a substrate subject to a process performed in the film deposition apparatus.

As shown in FIGS. 2 and 3, plural (five in the illustrated example) circular concave portions 24, each of which receives a substrate wafer W (referred to as a wafer), are formed in an upper surface of the turntable 2. The concave portions 24 are located along a circumferential direction (or a rotational direction of the turntable 2). The wafer W has plural convex parts 90 having pillar or line shapes on the upper surface of the wafer W, as shown in FIG. 9. Incidentally, only one wafer W placed in one of the concave portions 24 is illustrated in FIG. 3.

Figure 4:
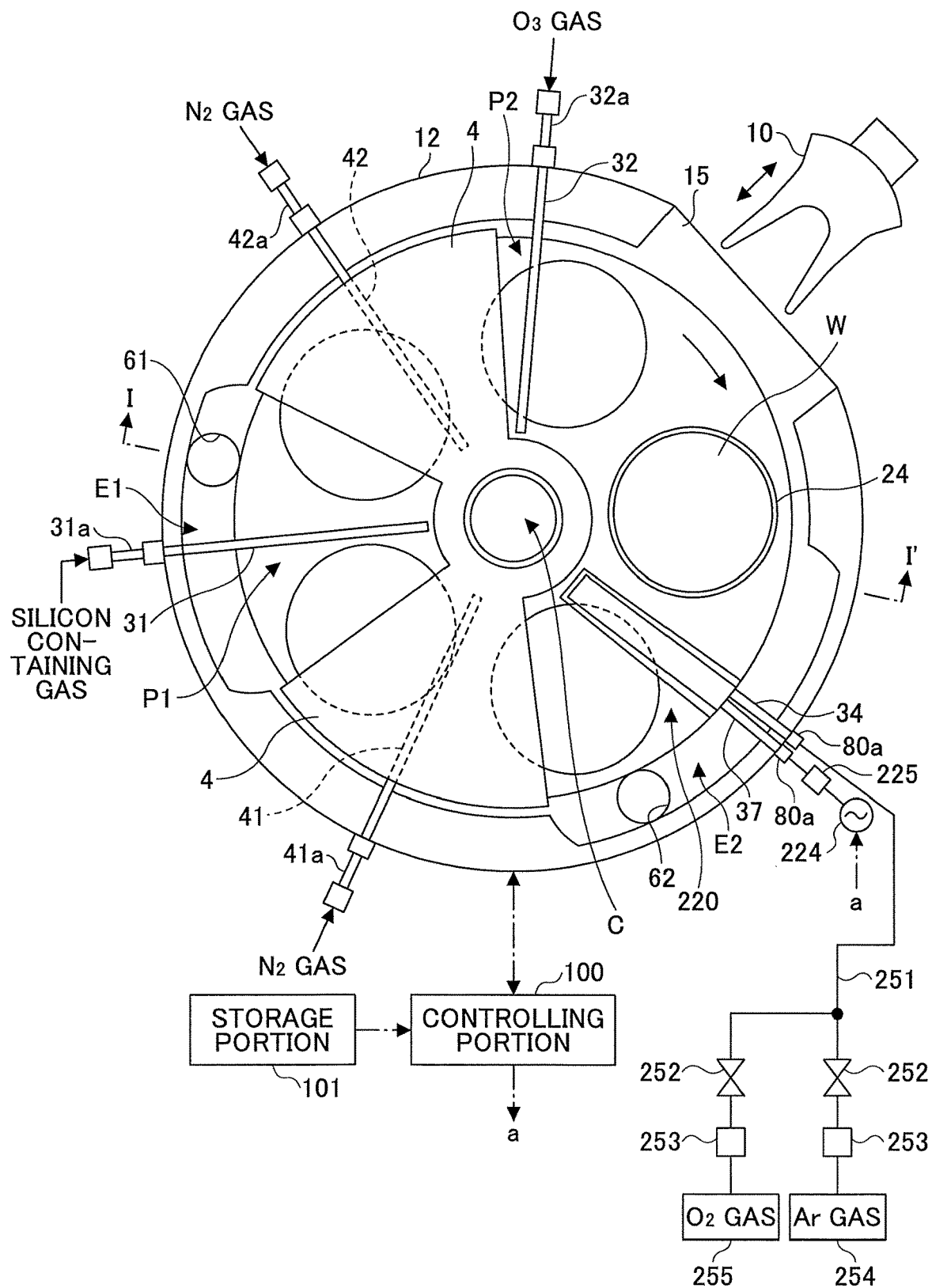
FIG. 4 is a plan view illustrating the film deposition apparatus.

As shown in FIG. 4, the concave portion 24 has a diameter slightly larger, for example, by 4 mm than the diameter of the wafer W and a depth equal to a thickness of the wafer W. Therefore, when the wafer W is placed in the concave portion 24, a surface of the wafer W is at the same elevation of a surface of an area of the turntable 2, the area excluding the concave portions 24. The concave portions 24 are wafer W receiving areas provided to position the wafers W and prevent the wafers W from being thrown out by centrifugal force caused by rotation of the turntable 2. In the bottom of the concave portion 24 there are formed three through-holes (not shown) through which three corresponding elevation pins (described later) are raised/lowered. The elevation pins support a back surface of the wafer W and raise/lower the wafer W.

As shown in FIGS. 3 and 4, a first reaction gas nozzle 31, a second reaction gas nozzle 32, separation gas nozzles 41, 42, and an activated gas injector 220, all of which may be formed of, for example, quartz, are arranged in radial directions and at predetermined angular intervals in the circumferential direction (or the rotation direction of the turntable 2). The nozzles 31, 32, 41, 42 oppose an area through which the concave portions 24 of the turntable 2 pass. In the illustrated example, the activated gas injector 220, the separation gas nozzle 41, the first reaction gas nozzle 31, the separation gas nozzle 42, and the second reaction gas nozzle 31 are arranged in this order in a clockwise direction (or the rotation direction of the turntable 2) from a transfer opening 15 (described later). The activated gas injector 220 and the nozzles 31, 32, 41, 42 are introduced into the vacuum chamber 1 from an outer circumferential wall of the chamber body 12, in order to extend along a radius direction of the chamber body 12 and to be parallel with the upper surface of the turntable 2. Gas introduction ports 31a, 32a, 41a, 42a serving as base ends of the corresponding nozzles 31, 32, 41, 42 go through the outer circumferential wall of the chamber body 12. The first reaction gas nozzle 31 and the second reaction gas nozzle 32 serve as a first reaction gas supplying portion and a second reaction gas supplying portion, respectively; and the separation gas nozzles 41, 42 serve as a separation gas supplying portion. The activated gas injector 220 is described later.

The reaction gas nozzle 31 is connected to a gas supplying source (not shown) of a first reaction gas containing silicon (Si) such as a diisopropyl amino silane (DIPAS) gas and a bis (tertiary-butylamino) silane $(SiH_2(NH-C(CH_3)_3)_2$: BTBAS) gas, via a flow rate control valve (not shown). The second reaction gas nozzle 32 is connected to a gas supplying source (not shown) of a second reaction gas such as a mixed gas of ozone ($O_3$) gas and oxygen ($O_2$) gas, or the combination thereof, via a flow rate control valve (not shown). The separation gas nozzles 41, 42 are connected to a gas supplying source (not shown) of nitrogen ($N_2$) gas serving as a separation gas, via a flow rate control valve (not shown). Incidentally, the following explanation is made with the $O_3$ gas used as the second reaction gas.

The reaction gas nozzles 31, 32 have plural ejection holes (not shown) open downward arranged in longitudinal directions of the reaction gas nozzles 31, 32, for example, at equal intervals thereby to eject the corresponding source gases to the turntable 2. An area below the reaction gas nozzle 31 is a first process area P1 in which the silicon-containing gas is adsorbed on the wafer W. An area below the second reaction gas nozzle 32 is a second process area P2 in which the silicon-containing gas adsorbed on the wafer W is oxidized by the $O_3$ gas.

The separation gas nozzles 41, 42 have plural ejection holes (not shown) arranged, for example, at equal intervals in longitudinal directions of the separation gas nozzles 41, 42 thereby to eject the separation gases downward from the plural ejection holes 40. The separation nozzles 41, 42 form corresponding separation areas D that separate the first process area P1 and the second process area P2. In the separation area D, a convex portion 4 having a top view shape of a sector is provided on the lower surface of the ceiling plate 11 of the vacuum chamber 1, as shown in FIGS. 3 and 4. The separation gas nozzles 41, 42 are housed in groove portions (not shown) in the corresponding convex portions 4.

With the above configuration, there are flat low ceiling surfaces 44 (first ceiling surfaces) on both sides of the separation gas nozzle 41 (or 42), and high ceiling surfaces 45 (second ceiling surfaces) outside of the corresponding low ceiling surfaces 44. Taking for an example the separation area D where the separation gas nozzle 41 is provided, this separation area D impedes the second reaction gas, which flows in the rotation direction of the turntable 2, from entering a space below the convex portion 4, and the first reaction gas, which flows in a direction opposite to the rotation direction of the turntable 2, from entering the space below the convex portion 4.

Figure 6:
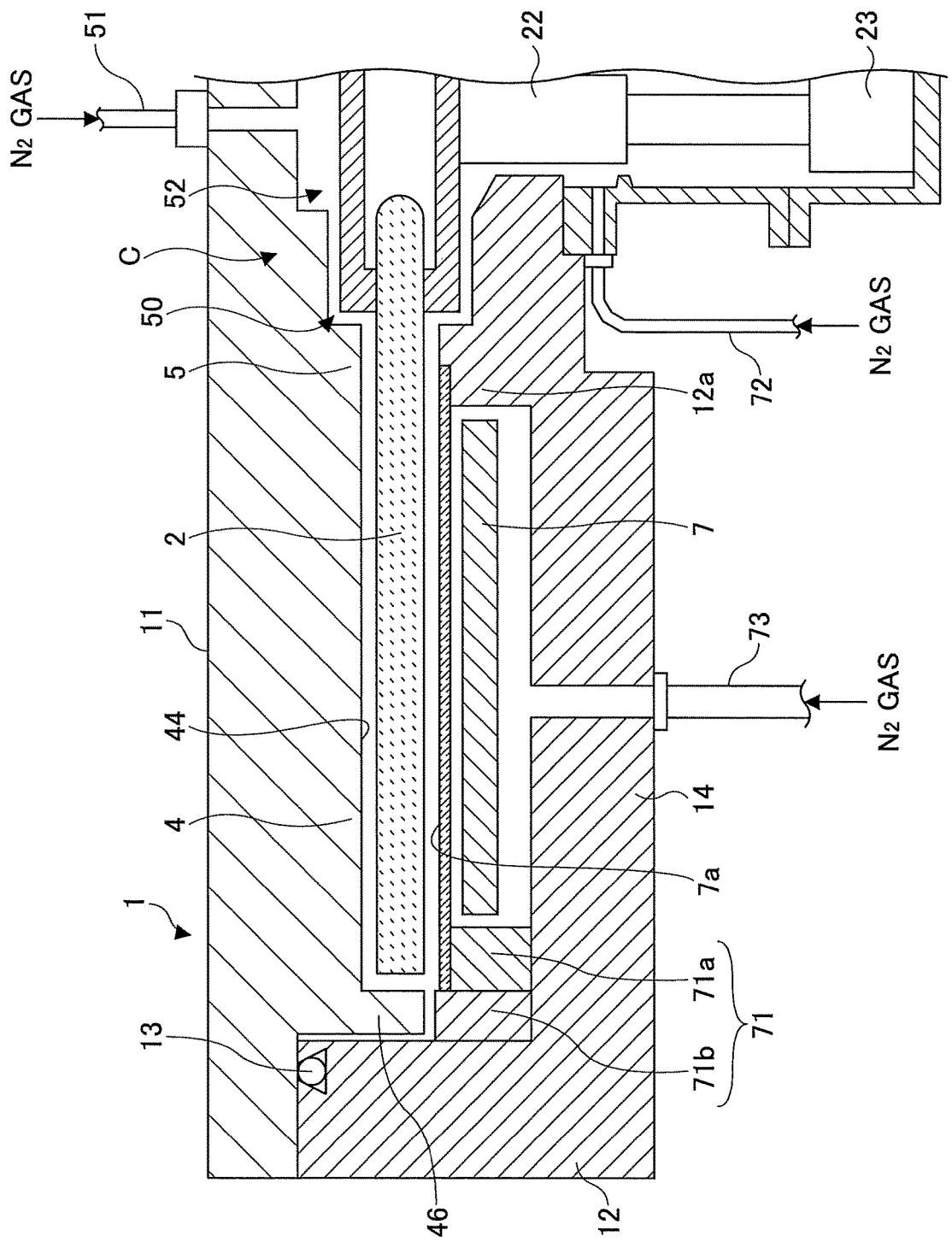
FIG. 6 is a cross-sectional view illustrating a part of the inner structure of the film deposition apparatus.
Figure 7:
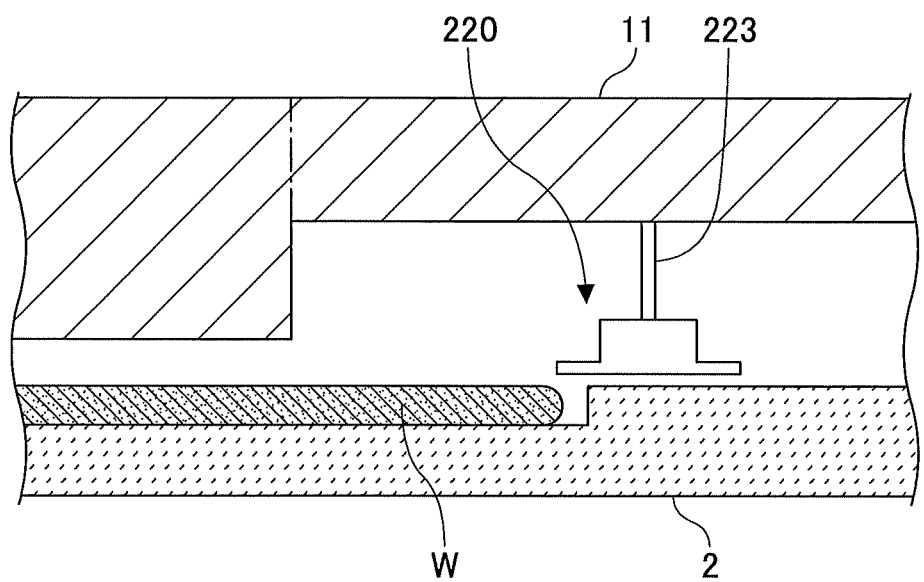
FIG. 7 is another cross-sectional view illustrating a part of the inner structure of the film deposition apparatus.

On the other hand, a protrusion portion 5 is provided on the lower surface of the ceiling plate 11, as shown in FIGS. 6 and 7. The protrusion portion 5 is formed to be continuous with the inner arc of the convex portion 4, in this embodiment, so that the lower surface of the protrusion portion 5 is at the same level as that of the convex portion 4 (or the ceiling surface 44). FIGS. 3 and 4 illustrate the vacuum chamber 1 as if the vacuum chamber 1 was horizontally severed at a level lower than the ceiling surface 45 and higher than the separation nozzles 41, 42. In addition, FIG. 2 illustrates a vertical cross section of the vacuum chamber 1 where the high ceiling surfaces 45 are provided, and FIG. 6 illustrates half of a vertical cross section of the vacuum chamber 1 where the low ceiling surface 44 is provided.

In a circumferential portion of the sector-shaped convex portion 4 (or an outer circumferential portion facing the inner surface of the chamber body 12), there is provided a bent portion 46 that bends in an L-shape, as shown in FIGS. 3 and 6. The bent portion 46 opposes the outer circumferential surface of the turntable 2 with a slight gap in relation to the inner circumferential surface of the chamber body 12. The bent portion 46 is provided in order to impede the reaction gases from entering the separation area D from the both sides of the separation area D and from being mixed. Gaps between the outer circumferential surface of the turntable 2 and the inner circumferential surface of the bent portion 46 and between the outer circumferential surface of the bent portion 46 and the inner circumferential surface of the chamber body 12 may be as narrow as the height of the ceiling surface 44 with respect to the turntable 2, for example.

A circumferential wall of the chamber body 12 is indented outward in areas that do not correspond to the separation areas D, as shown in FIGS. 2 and 4, so that there is a relatively large space with respect to the outer circumferential surface of the turntable 2 and from the bottom of the chamber body 12 up to the outer circumferential surface of the turntable 2. In the following explanation, the space having substantially a box shape is referred to as an evacuation area. Specifically, the evacuation area in gaseous communication with the first process area P1 is referred to as a first evacuation area E1, and the evacuation area in gaseous communication with the second process area P2 is referred to a second evacuation area E2, hereinafter (see FIG. 4). At the bottoms of the first and the second evacuation areas E1, E2, a first evacuation port 61 and a second evacuation port 62 are formed, respectively, as shown in FIGS. 2 and 4. The first and the second evacuation ports 61, 62 are connected to a vacuum pump 64 serving as an evacuation unit via an evacuation pipe 63, as shown in FIG. 2. The evacuation pipe 63 is provided with a pressure controller 65 that controls an inner pressure in the vacuum chamber 1.

As shown in FIGS. 2 and 6, a heater unit 7 serving as a heating portion is provided in a space between the bottom portion 14 of the chamber body 12 and the turntable 2, so that the wafers W placed on the turntable 2 can be heated through the turntable 2 at a predetermined temperature, for example 300° C., which is determined by a process recipe. In addition, a ring-shaped cover member 71 is provided beneath the turntable 2 and near the outer circumference of the turntable 2 in order to surround the heater unit 7, so that the space where the heater unit 7 is placed is partitioned from the outside area of the cover member 71, thereby impeding the gas from entering the space below the turntable 2. The cover member 71 includes an inner member 71a provided to face the outer circumferential portion of the turntable 2 and an area outside of the turntable 2 from below, and an outer member 71b provided between the inner member 71a and the inner circumferential surface of the chamber body 12, as shown in FIG. 6. The outer member 71b is severed in part in order to leave spaces above the evacuation ports 61, 62, thereby allowing a space above the turntable 2 to be in gaseous communication with the evacuation ports 61, 62. In addition, the upper surface of the outer member 71b comes close to the bent portion 46.

Referring to FIG. 2, a part of the bottom portion 14 of the vacuum chamber 1 comes close to the lower surface of the core portion 21. This part is referred to as a protrusion portion 12a. There is a narrow space between the protrusion portion 12a and the core portion 21, and the case body 20 is provided with a purge gas supplying pipe 72. In addition, plural purge gas supplying pipes 73 are arranged along the circumferential direction of the chamber body 12 and connected to areas below the heater unit 7 in order to purge the space where the heater unit 7 is housed. A cover member 7a, which may be formed of, for example, quartz glass, is supported by the upper surface of the cover member 71 and the upper portion of the protrusion portion 12a, so that the heater unit 7 is covered by the cover member 7a and thus gases are substantially impeded from entering the space where the heater unit 7 is housed.

In addition, a separation gas supplying pipe 51 is connected to the top center portion of the ceiling plate 11 of the vacuum chamber 1, so that $N_2$ gas is supplied as a separation gas to a space 52 between the ceiling plate 11 and the core portion 21. The separation gas supplied to the space 52 flows through a narrow gap 50 between the protrusion portion 5 and the turntable 2 and then along the top surface of the turntable 2 to the outer circumference of the turntable 2, thereby impeding the reaction gases (silicon-containing gas and $O_3$ gas) from being intermixed through the center portion of the turntable 2. Incidentally, an area defined by the ceiling plate 11, the core portion 21, and the protrusion portion 5 is referred to as a center area C. Moreover, the vacuum chamber 1 is provided in the outer circumferential wall with the transport opening 15 through which the wafer W is transferred into or out from the vacuum chamber 1 by a transfer arm 10 (see FIG. 3). The transfer opening 15 is provided with a gate valve (not shown) by which the transfer opening 15 is opened or closed. Because the wafer W is transferred into the vacuum chamber 1 through the transfer opening 15 and placed in the concave portion 24 in the turntable 2, lift pins are provided in an area facing the transfer opening 16 below the turntable 2. The lift pins can be moved upward/downward through corresponding through-holes (not shown) formed in the turntable 24 by an elevation mechanism (not shown), so that the wafer W is transferred between the transfer arm 10 and the concave portion 24 of the turntable 2.

Figure 5:
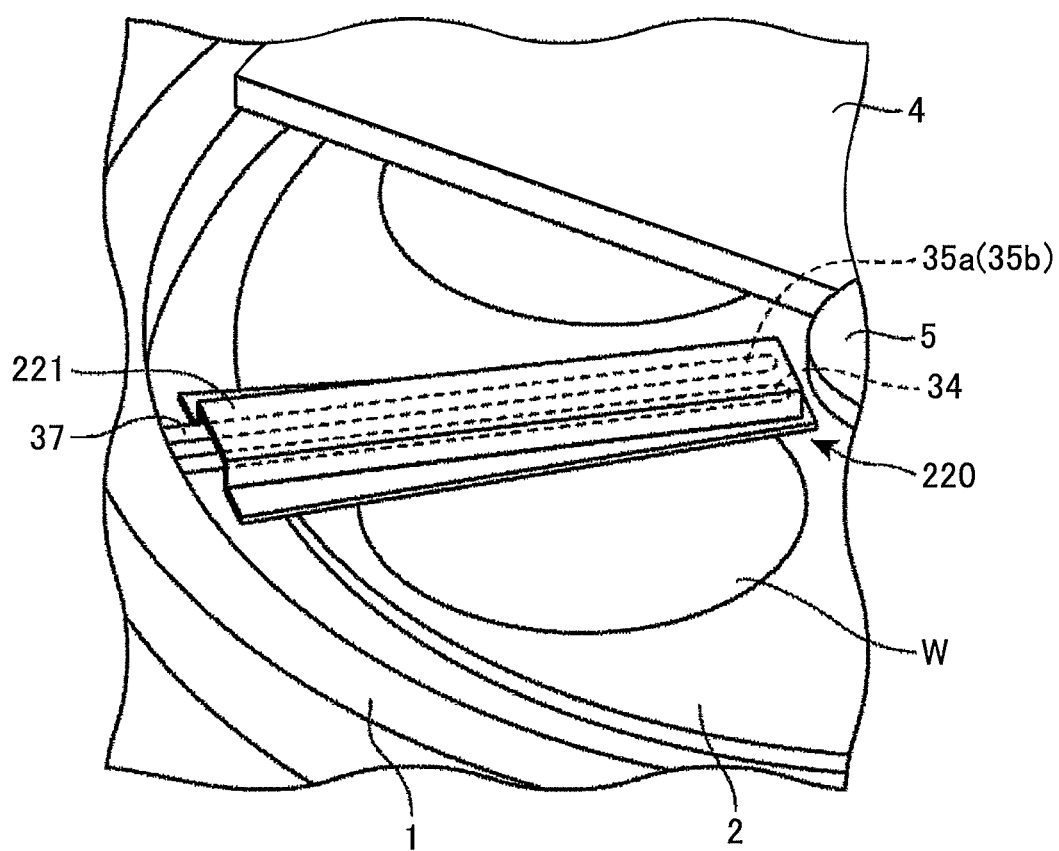
FIG. 5 is a perspective view illustrating a part of the inner structure of the film deposition apparatus.
Figure 8:
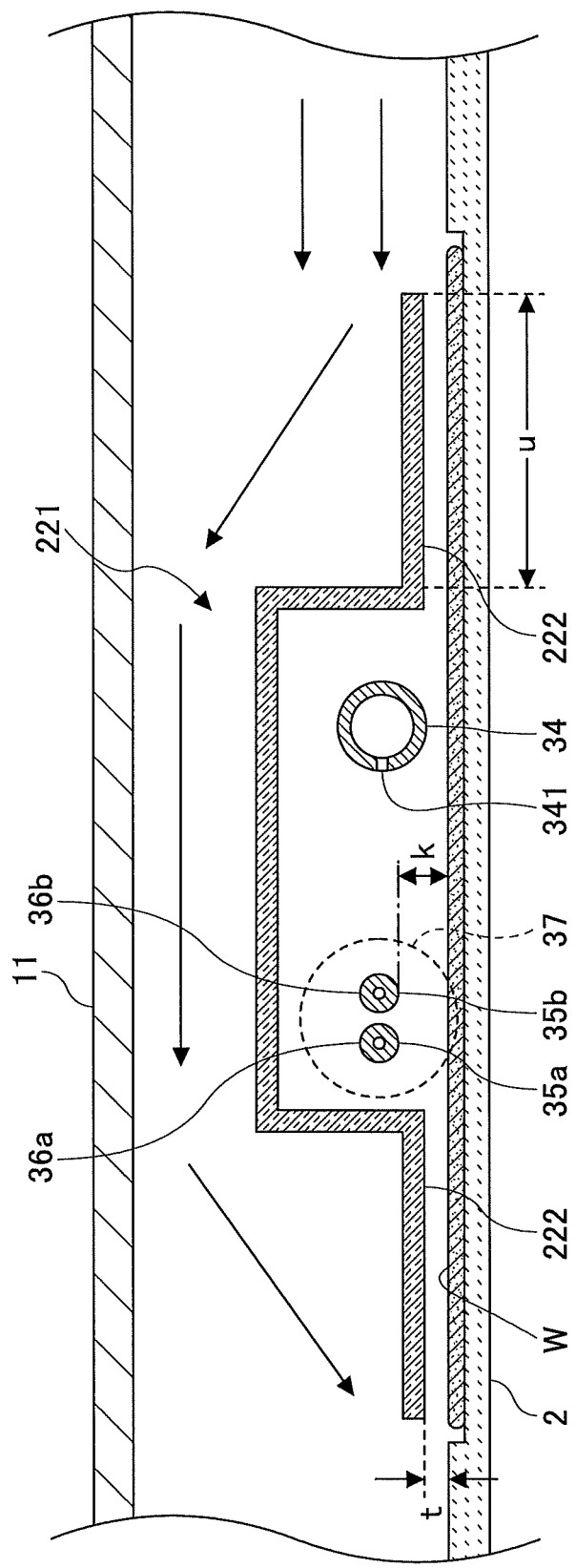
FIG. 8 is a cross-sectional view illustrating an example of an activated gas injector provided in the film deposition apparatus.

Next, the activated gas injector 220 is described. The activated gas injector 220 is arranged to generate plasma in an area above the concave portions 24 of the turntable 2 and along the radius direction of the turntable 2 thereby to alter properties of a silicon oxide film deposited on the wafers W through reaction of the silicon-containing gas and the $O_3$ gas. As shown in FIGS. 5 and 8, the activated gas injector 220 is provided with a gas introduction nozzle 34 that may be made of, for example, quartz glass and serves as a property alteration gas supplying portion that supplies a process gas from which plasma is substantially generated in the vacuum chamber 1, and a pair of sheath pipes 35a, 35b located downstream relative to the gas introduction nozzle 34 along the rotation direction of the turntable 2. The sheath pipes 35a, 35b extend parallel with each other and generate the plasma from the process gas supplied from the gas introduction nozzle 34. In addition, the gas introduction nozzle 34 and the sheath pipes 35a, 35b are introduced in an air-tight manner from the outer circumferential wall of the chamber body 12 to the center of the turntable 2, are parallel with the wafer W on the turntable 2, and orthogonally traverse the rotation direction of the turntable 2. Protection pipes 37 are connected to a base end side of the sheath pipes 35a, 35b (FIGS. 3 and 8). Plural gas holes 341 are formed in and along a longitudinal direction of the gas introduction nozzle 34.

Referring to FIG. 4, the gas introduction nozzle 34 is connected to one end of a plasma gas introduction line 251 that supplies the process gas for generating the plasma, and the other end of the plasma gas introduction line 251 is branched into two branch lines that are connected to an argon (Ar) gas supplying source 254 and an oxygen ($O_2$) gas supplying source 255, respectively. Each of the two branch lines is provided with a valve 252 and a flow rate controller 253.

The sheath pipes 35a, 35b may be made of, for example, quartz, alumina (aluminum oxide), ittria (ittrium oxide), or the like. As shown in FIG. 8, electrodes 36a, 36b are inserted into the corresponding sheath pipes 35a, 35b thereby to constitute parallel electrodes. The electrodes 36a, 36b may be made of, for example, nickel alloy, titanium, or the like. A distance k between the electrodes 36a, 36b and the wafer W on the turntable 2 is about 7 mm in this embodiment. These electrodes 36a, 36b are connected to a high frequency power supply 224 via a matching box 225, as shown in FIG. 4. High frequency electric power, which may have, for example, a frequency of 13.56 MHz and electric power of 500 W or less, is supplied to the electrodes 36a, 36b from the high frequency power supply 224. Incidentally, the sheath pipes 35a, 35b are simplified in the drawings except for FIG. 8.

As shown in FIG. 8, the gas introduction nozzle 34 and the sheath pipes 35a, 35b are provided with a cover body 221. The cover body 221 is arranged to cover a top and side (both sides along the long and short edges) of the gas introduction nozzle 34 and the sheath pipes 35a, 35b. The cover body 221 is made of an insulating material such as quartz. In addition, the cover body 221 is provided with flow limiting surfaces 222 that extend in a flange shape. Specifically, the flow limiting surfaces 222 are provided from one end through the other end of the cover body 221 along the longitudinal direction of the cover body 221 and extend outward from the corresponding lower edge portions of the cover body 221. According to the flow limiting surfaces 222, the gases such as the $O_3$ gas and the $N_2$ gas flowing along the rotation direction of the turntable 2 over the upper surface of the turntable 2 are impeded from entering the inside of the cover body 221. In addition, the flow limiting surfaces 222 are arranged close to the upper surface of the turntable 2 so that a gap t between the flow limiting surface 222 and the upper surface of the turntable 2 is small enough to efficiently impede the gases from entering the inside of the cover body 221. Moreover, the flow limiting surface 222 has a width u that becomes greater in the rotation direction of the turntable 2 along a direction toward the inner circumferential surface of the chamber body 12. The cover body 221 is supported by plural supporting members 223 (see FIG. 6) connected to the ceiling plate 11 of the vacuum chamber 1.

Figure 10:
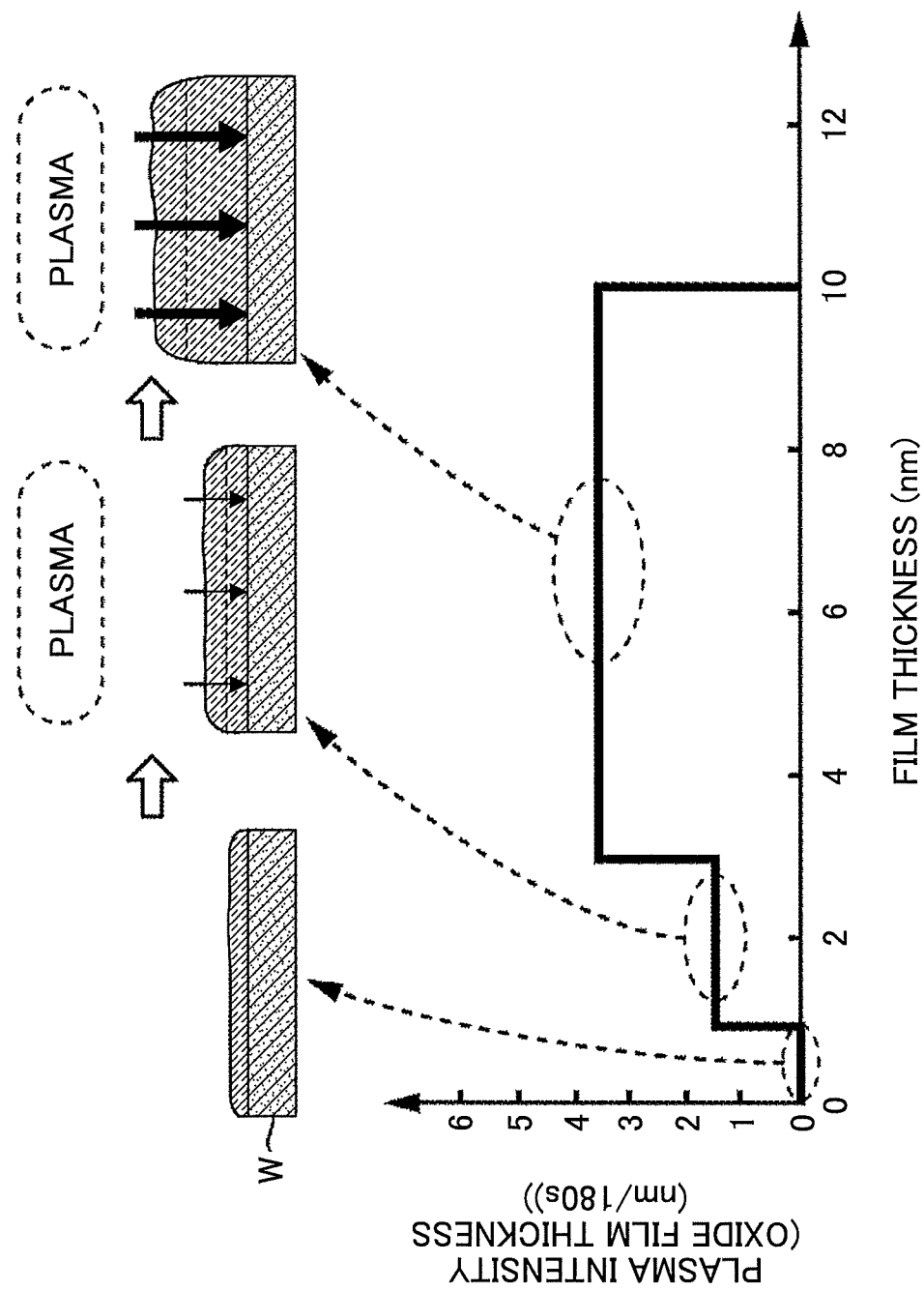
FIG. 10 is a schematic view illustrating a process performed in the film deposition apparatus.

In addition, the film deposition apparatus according to this embodiment is provided with a controlling part 100, which is made of a computer, for controlling entire operations of the film deposition apparatus. The controlling part 100 includes a memory device (not shown) that stores a computer program that causes the film deposition apparatus to carry out a film deposition—alteration step including a film deposition step and an alteration step. Here, the film deposition step and the alteration step are briefly explained. In the film deposition step, the silicon oxide film, which is made of the reaction product of the silicon-containing gas and the $O_3$ gas, is formed, and in the alteration step, the reaction product is altered or densified. In addition, the film deposition step and the alteration step are alternately repeated so that plural layers of the reaction product are accumulated on the wafer W. In this case, the controlling part 100 outputs a controlling signal to the high frequency power source 224 in order to adjust (or change) plasma intensity in the alteration step so that the silicon oxide film is uniformly altered in a thickness direction of the silicon oxide film while the plasma is prevented from penetrating through the silicon oxide film to reach the wafer W, which is made of silicon. For example, when a film thickness of the silicon oxide is small, or at an initial stage of the repeatedly performed film deposition and alteration step, the plasma intensity is zero, and as the film thickness is increased, or as the number of the film deposition steps is increased, the plasma intensity is increased in a stepwise manner, as shown in FIG. 10. Incidentally, the controlling portion 100 may output a controlling signal to the pressure controller 65 in order to adjust the inner pressure in the vacuum chamber 1.

Figure 11:
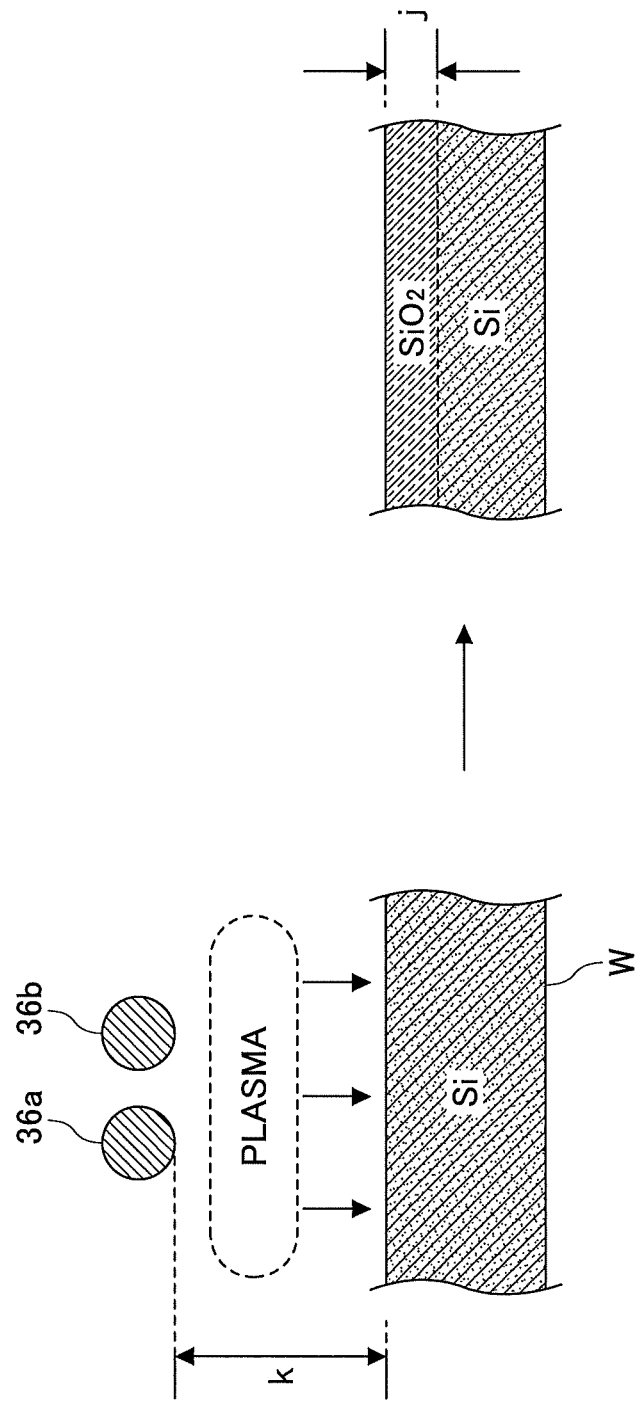
FIG. 11 is an explanatory view for explaining plasma intensity.
Figure 16:
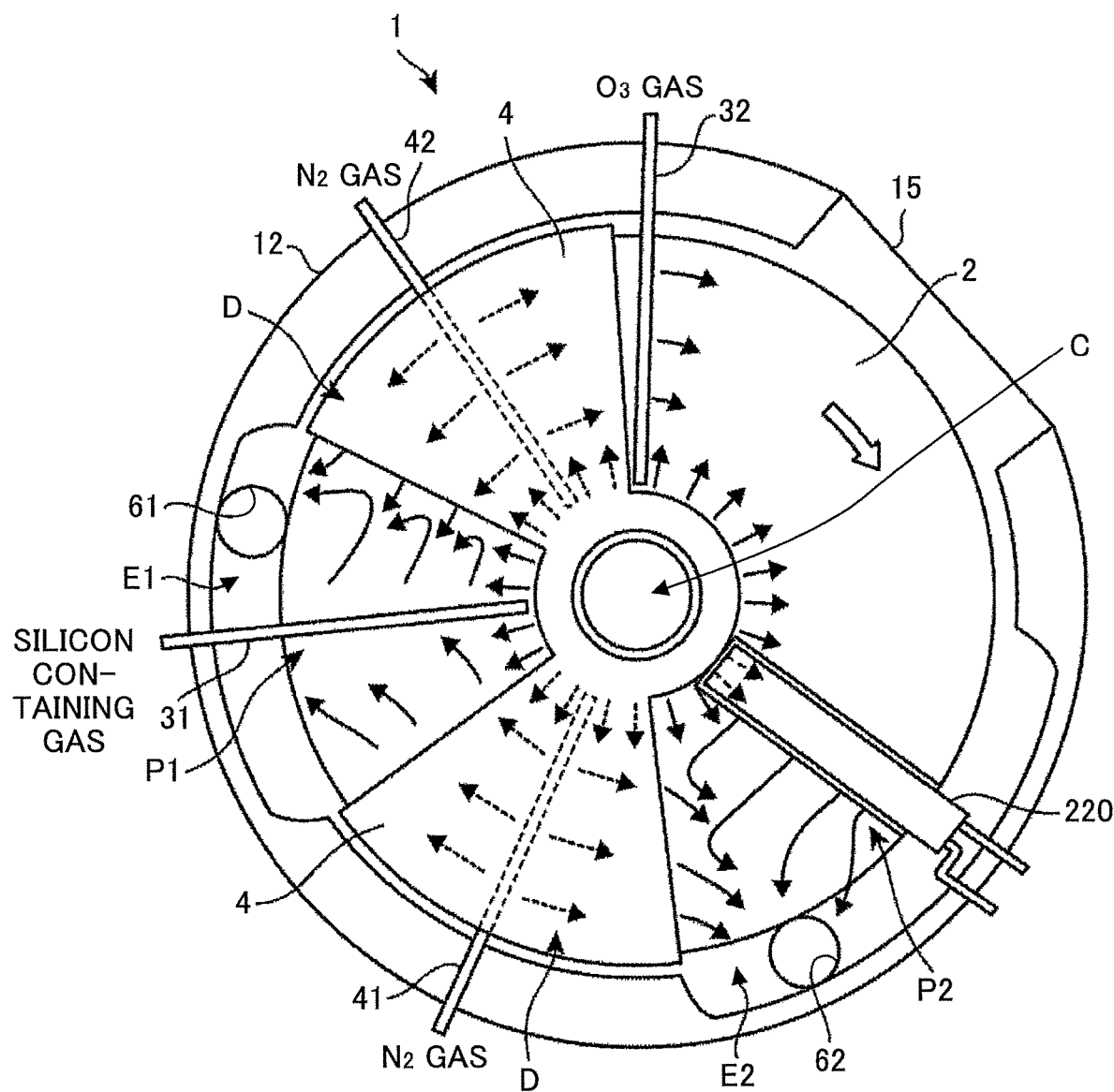
FIG. 16 is a schematic view illustrating gas flow in the film deposition apparatus.

Here, "plasma intensity" is referred to as intensity of plasma to which the wafer W is exposed, and differs depending on electric power supplied to the electrodes 36a, 36b, an inner pressure in the vacuum chamber 1, an exposure time of the plasma to the wafer W, a distance k between the electrodes 36a, 36b, and the like. In order to quantitatively express the "plasma intensity", a film thickness j of a silicon oxide film obtained by continuously exposing the upper surface of the wafer W (or a silicon layer) to plasma for 180 s, as shown in FIG. 11, is used as an indicator in this embodiment. For example, when a silicon oxide film having a thickness of 1 nm is obtained after the upper surface of the wafer W is exposed to plasma for 180 s under certain conditions, the plasma intensity in this case is expressed as "plasma intensity corresponding to the film thickness j of 1 nm". Similarly, when a silicon oxide film having a thickness of 2 nm is obtained, the plasma intensity is expressed as "plasma intensity corresponding to the film thickness j of 2 nm".

When the film deposition—alteration process is being carried out, the plasma intensity is adjusted with electric power supplied to the electrodes 36a, 36b while other parameters such as the inner pressure in the vacuum chamber 1 are kept constant. Specifically, when the distance k between the electrodes 36a, 36b and the wafers W having diameters of 300 mm is set to the above value and the inner pressure in the vacuum chamber 1 is kept at 266 Pa (2 Torr), the electric power supplied to the electrodes 36a, 36b of 30 W provides the film thickness j corresponding to 1 nm, and the electric power supplied to the electrodes 36a, 36b of 65 W provides the film thickness j corresponding to 2 nm. A relationship between the electric power and the film thickness j depends on process conditions, and thus preferably is obtained in advance by, for example, carrying out an experiment using, for example, test wafers, under predetermined conditions.

Incidentally, the program includes groups of steps or instructions that cause the constituting members or parts of the film deposition apparatus to perform the film deposition—alteration process. The program is stored in a memory portion 101 (FIG. 4), which is a computer readable storage medium such as a hard disk, a compact disk, a magneto-optical disk, a memory card, a flexible disk, or the like, and installed into the control part 100.

Next, the operations of the film deposition apparatus according to this embodiment (film deposition method) are described in the following. First, the wafer W is transferred into the vacuum chamber 1 through the transfer opening 15 by the transferring arm 10, after the gate valve (not shown) is opened. Specifically, when one of the concave portions 24 of the turntable 2 is in alignment with the transfer opening 15 by appropriately rotating the turntable 2, the wafer W is placed in the concave portion 24 of the turntable 2 by the lift pins (not shown) and the transfer arm 10 that cooperatively operate. Such operations are intermittently repeated so that five wafers W are placed in the corresponding concave portions 24 of the turntable 2. Next, after the transfer arm 10 recedes from the vacuum chamber 1, the gate valve (not shown) is closed, and the vacuum chamber 1 is evacuated to the lowest reachable pressure by the vacuum pump 64. Then, the turntable 2 starts rotating in a clockwise direction at a rotational speed of, for example, 120 revolutions per minute, and the wafers W on the turntable are heated at, for example, 300° C. The $N_2$ gas is supplied at predetermined flow rates from the separation gas nozzles 41, 42, the separation gas supplying pipe 51, and the purge gas supplying pipes 72. Subsequently, the silicon-containing gas is supplied from the reaction gas nozzle 31; the $O_3$ gas is supplied from the second reaction gas nozzle 32; and the Ar gas and the $O_2$ gas are supplied at flow rates of, for example, 9.5 standard liters per minute (slm) and 0.5 slm, respectively, from the gas introduction nozzle 34. The vacuum chamber 1 is maintained at a predetermined pressure, for example, 266 Pa (2 Torr) by the pressure controller 65.

With the rotation of the turntable 2, the silicon-containing gas is adsorbed on the upper surface of the wafer W in the first process area P1, and the adsorbed silicon-containing gas on the upper surface of the wafer W is oxidized by the $O_3$ gas in the second process area P2, so that one molecular layer or plural molecular layers of the reaction product, i.e., silicon oxide is formed in the film deposition step (or a cycle of supplying reaction gases to the upper surface of the wafer W). In this case, because no high frequency power is supplied to the electrodes 36a, 36b, the plasma intensity is zero (a first plasma intensity). With this, the molecular layer or the plural molecular layers may include impurities such as organic groups and/or moisture (OH groups), which originate from, for example, the silicon-containing gas. After the film deposition step is continued by rotating the turntable 2 until a film thickness of the silicon oxide film becomes 1 nm, as shown in FIGS. 10 and 12, high frequency power of 45 W (a second plasma intensity) is applied across the electrodes 36a, 36b so that the plasma intensity corresponds to the oxide film thickness j of 1.5 nm. Incidentally, FIG. 12 schematically illustrates the wafer W and the reaction product deposited on the wafer W. FIGS. 13 and 14, which are referred to later, also schematically illustrate the wafer W and the reaction product.

In the activated gas injector 220, the Ar gas ejected from the gas introduction nozzle 34 toward the sheath pipes 35a, 35b is activated by high frequency electric power between the sheath pipes 35a, 35b into plasma including ions and/or radicals, which in turn flow downward toward the wafers W on the turntable 2, which is rotated, below the activated gas injector 220. When the wafer W reaches the area below the activated gas injector 220, the wafer W is exposed to the plasma and thus the alteration step that alters the silicon oxide film is carried out. Specifically, because the wafer W is bombarded with, for example, the ions and/or radicals, the impurities are degassed from the silicon oxide film, and the silicon atoms and the oxygen atoms are rearranged, resulting in densification of the silicon oxide film, as schematically shown in FIG. 15.

In this case, because the plasma intensity is set as described above, the plasma can enter or penetrate the silicon oxide film from the upper surface thereof through a vicinity of the upper surface of the underlying substance, which is the wafer W (silicon) in the illustrated example, as shown on the left side view of FIG. 13. Therefore, the silicon oxide film formed at the plasma intensity of zero (see the right side view of FIG. 12) can be uniformly altered in the thickness direction by the penetrating plasma, while the upper surface of the wafer W (silicon) is prevented from being oxidized. This film deposition—alteration step including the film deposition step and the alteration step is repeated plural times by rotating the turntable 2 until a film thickness of the silicon oxide film becomes 2 nm. With this, a thickness of the silicon oxide film is increased, and thus the lowest level (or the depth from the upper surface of the silicon oxide film) that the plasma can reach becomes gradually moved away from the upper surface of the wafer W. Incidentally, arrows in FIG. 13 schematically illustrate the plasma intensity. Arrows in FIG. 14, which is referred to later, also illustrate the plasma intensity.

Because the separation area D is not provided between the activated gas injector 220 and the second reaction gas injector 32 in the vacuum chamber 1, the $O_3$ gas and the separation gas ($N_2$ gas) flow toward the activated gas injector 220 from the upstream side of the activated gas injector 220 because of rotation of the turntable 2. However, such gases are least likely to flow through the space between the activated gas injector 220 and the turntable 2, because the gases flow through above the activated gas injector 220. This is because the activated gas injector 220 is provided with the cover body 221. Incidentally, the impurities removed from the silicon oxide film during the alteration step are turned into gas, and then the gas is evacuated together with the $O_2$ gas and the $N_2$ gas.

In addition, because the $N_2$ gas is supplied between the first process area P1 and the second process area P2 and the $N_2$ gas is supplied to the center area C, the silicon-containing gas and the $O_3$ gas are not intermixed with each other and are evacuated to the corresponding evacuation ports 61, 62. Incidentally, because the area below the turntable 2 is purged with the $N_2$ gas, for example, the silicon-containing gas that has flowed into the evacuation area E1 (or E2) cannot flow into the area where the $O_3$ gas is supplied through the space below the turntable 2.

Figure 17:
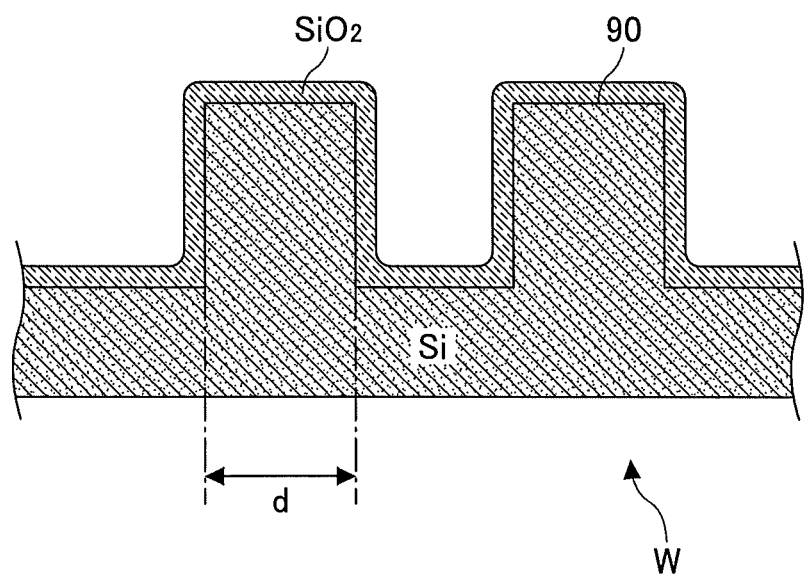
FIG. 17 is a schematic view illustrating a substrate processed in the film deposition apparatus.

Then, high frequency power is applied, for example, at 150 W across the electrodes 36$a$, 36$b$ in order to obtain the plasma intensity corresponding to the oxide film thickness j of 3.7 nm. In this case, the plasma can only reach the vicinity of the upper surface of the wafer W, as shown in FIG. 14, so that the silicon oxide film deposited on the wafer W is uniformly altered, but the upper surface of the wafer W is prevented from being oxidized. Next, the film deposition—alteration step is continued until a thickness of the silicon oxide film becomes 10 nm, a silicon oxide film, which has been densified along the film thickness direction, is formed to cover the convex portions 90 formed on the upper surface of the wafer W, while the upper surface of the wafer W is prevented from being oxidized, as shown in FIG. 17. Therefore, reduction of the width d of the convex portion 90, which may be caused by silicon oxide grow due to irradiation of plasma, can be avoided.

According to this embodiment, when the film deposition—alteration process composed of the film deposition step, where the reaction product is formed on the wafer W using the silicon-containing gas and the $O_3$ gas, and the alteration step, where the reaction product is altered by plasma, is repeated plural times, the plasma intensity is set to zero when a thickness of the reaction product (or at an initial stage of the film deposition—alteration process), and then the plasma intensity of the plasma supplied to the wafer W is increased in a stepwise manner as a thickness of the reaction product is increased (or as the number of the film deposition steps is increased). Therefore, the thin film, which is densified along the thickness direction uniformity, can be obtained while the upper surface of the wafer W can be prevented from being oxidized, thereby yielding an excellent device structure with a desired feature as shown in FIG. 17.

In addition, in the film deposition—alteration process, the alteration step is carried out with respect to the wafer W when the wafer W moves along from the second process area P2 to the first process area P1 in the vacuum chamber 1 every time after the film deposition step, in such a manner that the film deposition is not influenced by the alteration step. In addition, because the alteration process is carried out every time after the film deposition step in the film deposition—alteration process, the thin film can be altered in a shorter time compared to a case where the thin film is altered after the film deposition is completed.

Figure 18:
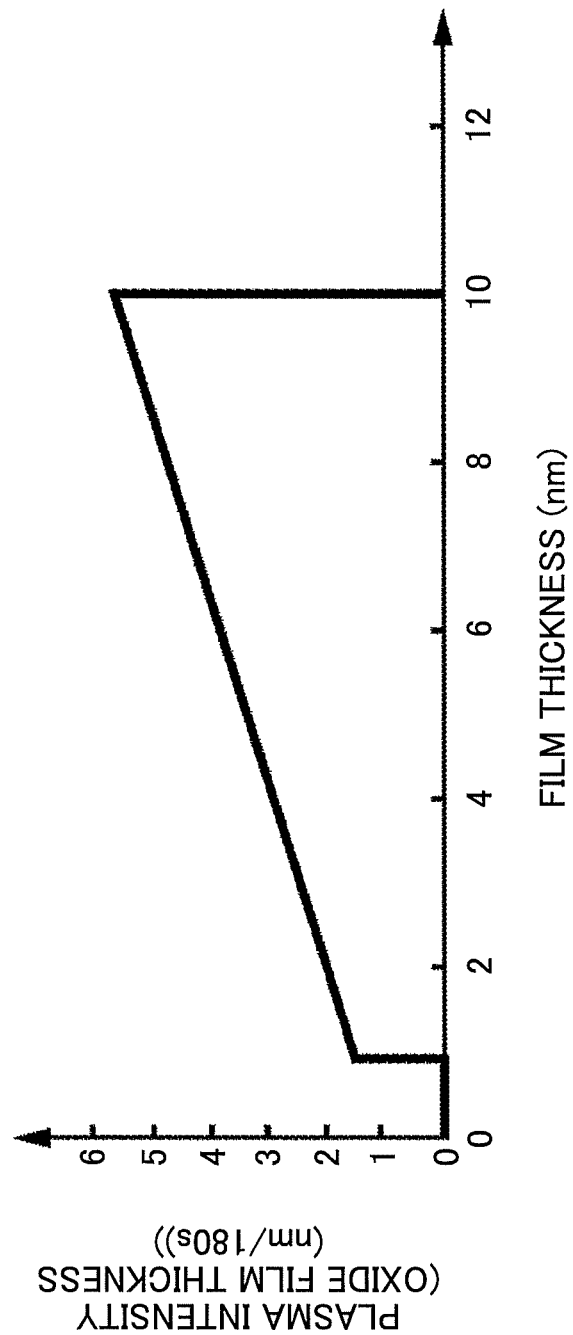
FIG. 18 is a schematic view illustrating another process performed in the film deposition apparatus.
Figure 19:
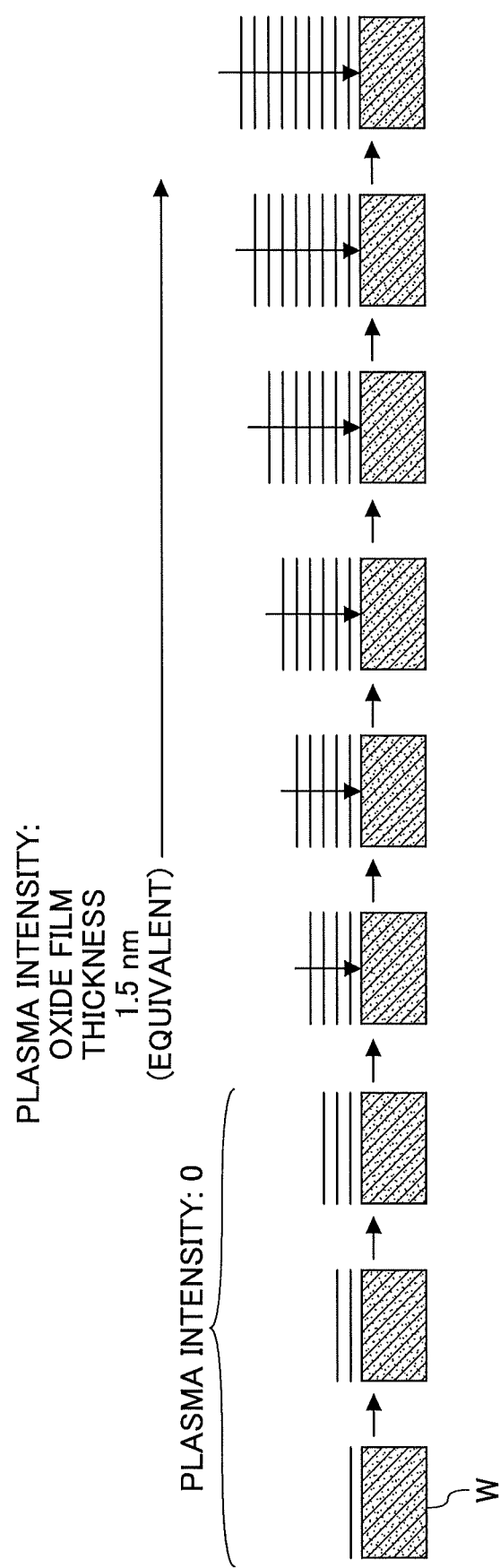
FIG. 19 is a schematic view illustrating yet another process performed in the film deposition apparatus.

Incidentally, while the plasma intensity is increased in a stepwise manner in the above example, the plasma intensity is continuously increased as the number of the film deposition steps is increased, or every turn of the turntable 2, as shown in FIGS. 18 and 19. Also in this case, the plasma intensity is set to zero at an initial stage of the film deposition—alteration process, or until a thickness of the reaction process reaches, for example, 1 nm. By adjusting the plasma intensity, the plasma can reach the vicinity of the upper surface of the wafer W, which underlies the thin film of the reaction product, in the alteration step. Therefore, the film can be uniformly altered along the thickness direction. Incidentally, FIG. 19 schematically illustrates the wafer W and the reaction product on the wafer W, where the plasma intensity is schematically represented by arrows.

Here, at the initial stage of the film deposition—alteration process, the high frequency power may be supplied at 5 W to the electrodes 36$a$, 36$b$ so that the plasma intensity corresponds to the oxide film thickness j of 0.2 nm. However, the plasma intensity is preferably set to zero because it is not easy to maintain the plasma at such a lower level.

A Second Embodiment

Figure 20:
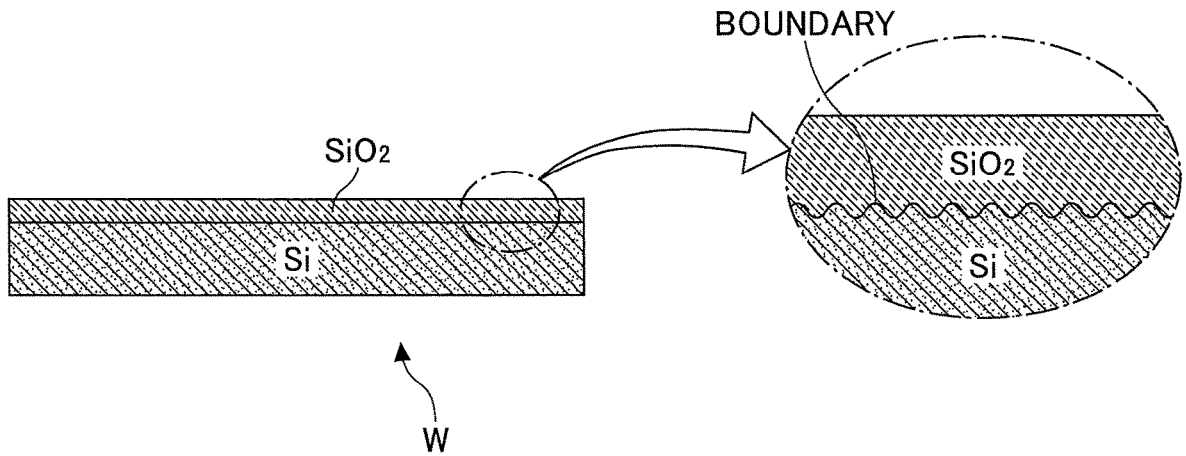
FIG. 20 is an explanatory view for explaining another example of the present invention.

Next, a second embodiment of the present invention is explained, where a silicon oxide film serving as a gate electrode film is formed on a substrate. While it is especially important for the gate electrode film to have excellent flatness at a boundary between the silicon oxide film and the underlying silicon wafer, a silicon oxide film formed by a conventional Chemical Vapor Deposition (CVD) method, an Atomic Layer Deposition (ALD) method or a Molecular Layer Deposition (MLD) method may have relatively degraded flatness, as schematically illustrated in FIG. 20, compared to a thermally grown silicon oxide film. In the following, a film deposition method according to the second embodiment of the present invention, which can form a silicon oxide film having excellent flatness at a boundary between the silicon oxide film and the underlying silicon wafer.

Figure 21:
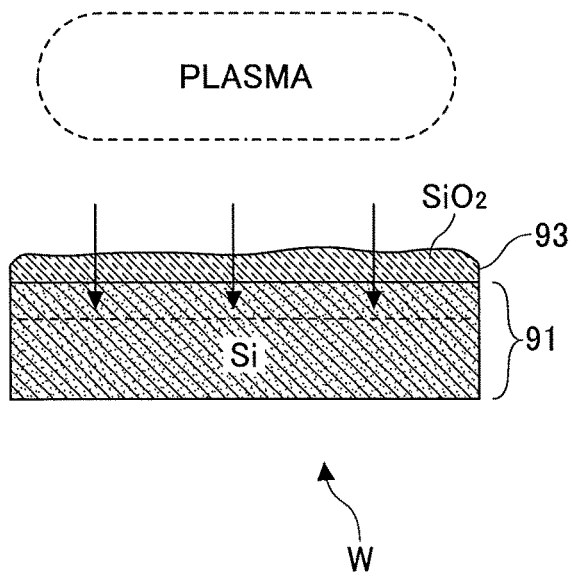
FIG. 21 is a schematic view illustrating a process performed with respect to a substrate, according to another example of the present invention.
Figure 24:
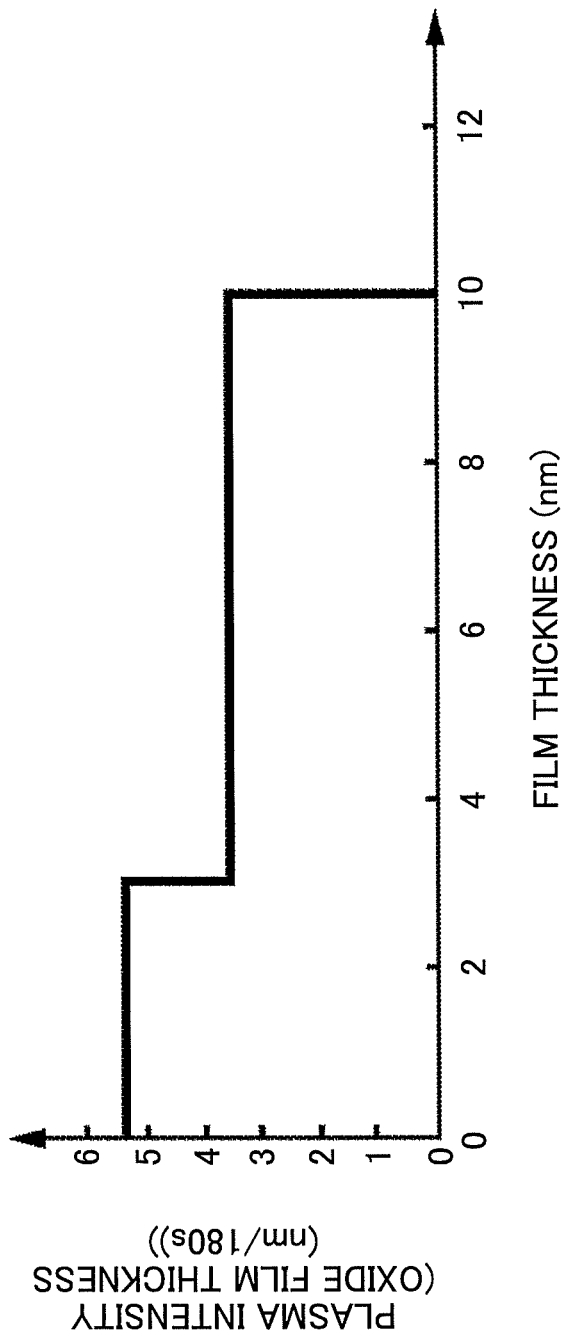
FIG. 24 is a schematic view illustrating a process performed with respect to a substrate, according to another example of the present invention.

Specifically, when the film deposition step and the alteration step are alternately performed by rotating the turntable 2, the alteration step is performed at a second plasma intensity, which corresponds to the oxide film thickness j of 5.3 nm (or by setting the high frequency power supplied to the electrodes 36a, 36b to 400 W) until a thickness of the reaction product reaches 3 nm, as shown in FIG. 24. This plasma can reach the wafer W through the thin film of the reaction product, thereby oxidizing the upper surface (or portion) of the wafer W, as shown in FIG. 21.

Figure 22:
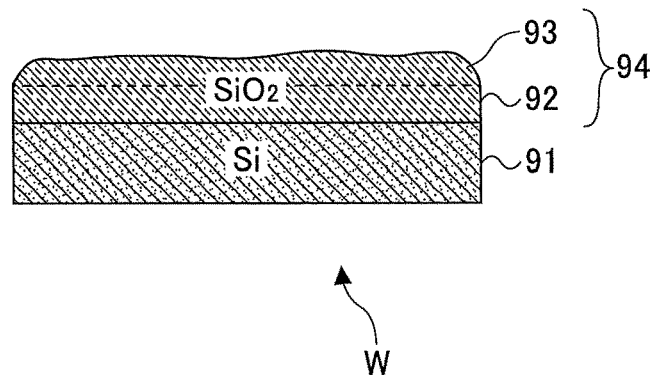
FIG. 22 is another schematic view illustrating a process performed with respect to a substrate, according to another example of the present invention.
Figure 23:
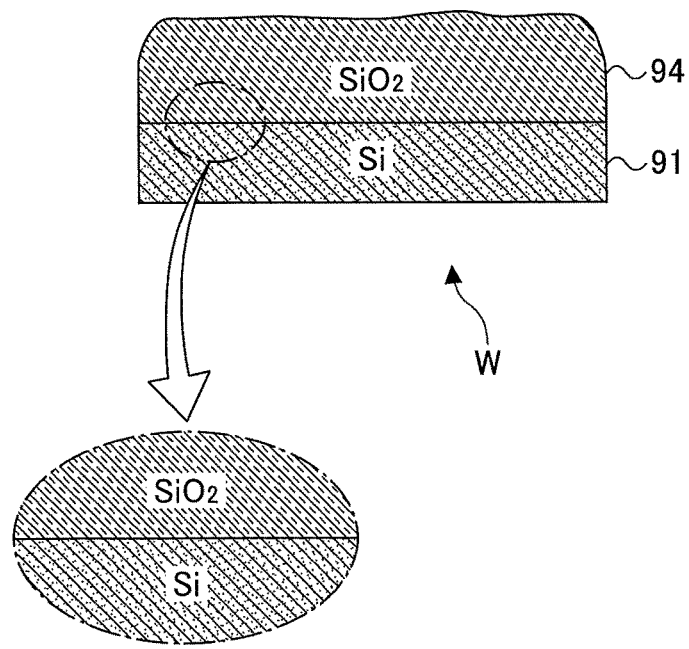
FIG. 23 is a schematic view illustrating a process performed with respect to a substrate, according to another example of the present invention.

Therefore, a first silicon oxide film 92 that is formed through the oxidization of the wafer W and a second silicon oxide film 93 that is formed by the film deposition—alteration process are formed on an underlying layer 91, which corresponds to an upper portion of the wafer W, as shown in FIG. 22. Namely, a silicon oxide film 94 composed of the first silicon oxide film 92 and the second silicon oxide film 93 is formed on the wafer W (the underlying film 91). Because the plasma-oxidized first silicon oxide film is generally likely to provide better flatness at the boundary in relation to the underlying film than the thermally grown silicon oxide film, an excellent flatness can be achieved between the silicon oxide film 94 and the underlying film 91.

Then, the film deposition step and the alteration step, which is performed at a first plasma intensity corresponding to the oxide film thickness j of 3.7 nm, are alternately performed until a thickness of the reaction product reaches 10 nm. With this, a thin film that is densified along the thickness direction and provides excellent flatness at the boundary in relation to the underlying film 91 can be obtained. Here, the plasma intensity is reduced from that corresponding to the oxide film thickness j of 5.3 nm to that corresponding to the oxide film thickness j of 3.7 nm, in order to avoid a further increase of a thickness of the first silicon oxide film 92 and to desirably control a thickness of the silicon oxide film 94.

Incidentally, while the plasma intensity is set to be relatively large at the initial stage of the film deposition in order to oxidize the upper surface (or portion) of the wafer W to form the plasma-oxidized silicon oxide film 92 in this embodiment, the plasma-oxidized silicon oxide film may be formed in the following manner in other embodiments. Namely, after the wafers W are placed in the substrate receiving areas 24 of the turntable 2, the vacuum chamber 1 is maintained at a predetermined pressure with the $N_2$ gas supplied from the separation gas supplying portions 41, 42 and the like and the turntable 2 starts rotating. Then, the plasma is generated by the activated gas injector 220. In this case, because the upper surface of the wafer W is exposed to the plasma, the upper surface is readily oxidized, so that the plasma-oxidized silicon oxide film is obtained. Next, after the turntable 2 is rotated plural (or at least two) times, the silicon-containing gas, the oxidizing gas, and the separation gases are supplied to the vacuum chamber 1 from the corresponding gas supplying nozzles 31, 32, 41, and 42, so that the film deposition step and the alteration step are alternately repeated. Even in this case, the densified silicon oxide film 94 can be formed on the wafer W. In this case, the plasma intensity may be lower after the film deposition step starts than before it starts, or may be the same after and before the film deposition step starts.

In the first and the second embodiments, influence incurred on the underlying layer of the thin film by the plasma can be controlled by adjusting the plasma intensity.

A Third Embodiment

Next, a third embodiment of the present invention is explained. FIG. 25 schematically illustrates multilayers of the reaction product and the plasma irradiated to the reaction product. Specifically, the plasma irradiated to the reaction product is indicated by arrows in the drawing, while a thickness of the reaction product is increased. More specifically, a vertical length (or range) of each of the arrows indicates a thickness of the reaction product that is exposed to the plasma as the thickness is increased. In other words, the leftmost arrow indicates that the plasma can penetrate through the reaction product having a thickness of about 3 nm into the wafer W from the upper surface of the reaction product.

When paying attention to a particular layer of the reaction product having a thickness of 3 nm to 10 nm, if the layer is close to the upper surface of the wafer W, the layer is exposed to the plasma certain times as long as the plasma can penetrate through the layer, because the alteration step is repeated. However, if the layer is close to the upper surface of the reaction product having a thickness of 10 nm, the layer is exposed to the plasma fewer times. Namely, the reaction product goes through the plasma alteration step different times depending on a thickness of the reaction product. On the other hand, when the plasma intensity is set to the oxide film thickness j of 5.3 nm with respect to the reaction product having a thickness of 3 nm or less, and is set to the oxide film thickness j of less than 5.3 nm with respect to the reaction product having a thickness of 3 nm through 10 nm, an irradiation amount of the plasma irradiated to the layer near the upper surface of the wafer W becomes larger than that irradiated to the layer near the upper surface of the reaction product having a thickness of 10 nm.

Figure 27:
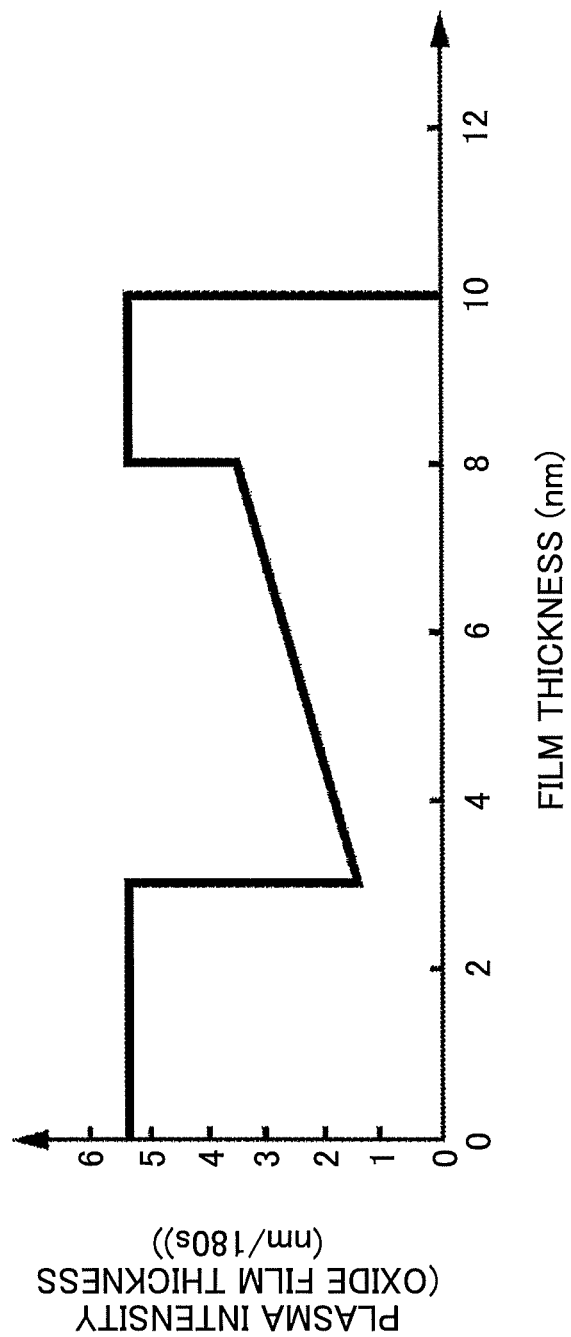
FIG. 27 is a schematic view illustrating another process according to another example of the present invention.

In view of the above, the plasma intensity is adjusted in this embodiment so that the irradiation amount of the plasma irradiated to the reaction product is equalized irrespective of a thickness of the reaction product. Specifically, as shown in FIGS. 26 and 27, an upper portion of the reaction product, which may correspond to thicknesses of 8 nm to 10 nm, is exposed to the plasma having a third plasma intensity corresponding to the oxide film thickness j of 5.3 nm. The third plasma intensity is greater than that of the plasma irradiated to the reaction product having a thickness of 8 nm to 10 nm in the second embodiment (see FIG. 24). In addition, the plasma intensity is set to the oxide film thickness j of 1.5 nm in order to reduce the irradiation amount of the plasma irradiated to the reaction product having a thickness of 3 nm or less, and linearly increased to the oxide film thickness j of 3.7 nm as a thickness of the reaction product is increased from 3 nm to 8 nm. By adjusting the plasma intensity in such a manner, a degree of alteration is equalized along the thickness direction of the reaction product, and thus a thin film having uniform film properties can be obtained.

Figure 28:
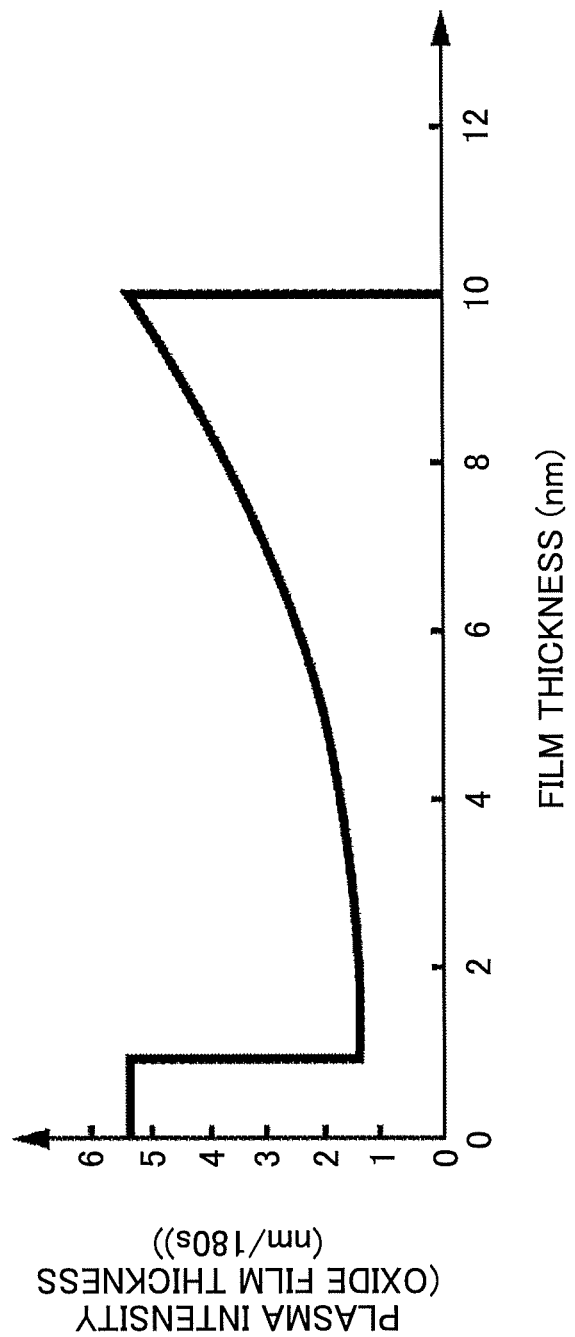
FIG. 28 is a schematic view illustrating another process according to another example of the present invention.
Figure 29:
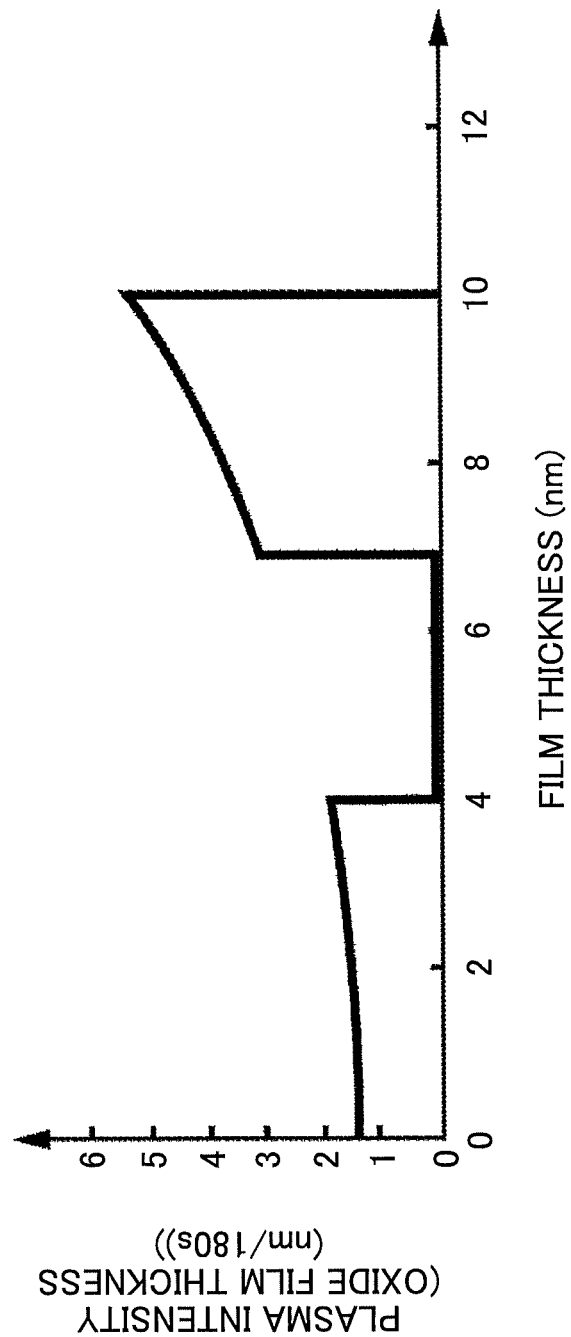
FIG. 29 is a schematic view illustrating another process according to another example of the present invention.

In addition, the plasma intensity is set to the oxide film thickness j of 5.3 nm with respect to the reaction product until a thickness of the reaction product reaches 1 nm in order to oxidize the underlying film 91 into the silicon oxide film 92, and gradually increased to the oxide film thickness j of 5.3 nm as a thickness of the reaction product is increased from 1 nm to 10 nm, as shown in FIG. 28.

Moreover, properties of the reaction product can be equalized along the thickness direction of the reaction product even in the first embodiment, in the same manner as the third embodiment. Specifically, the plasma intensity is gradually increased from the plasma intensity corresponding to the oxide film thickness j of 1.5 nm to the plasma intensity corresponding to the oxide film thickness j of 2 nm as a thickness of the reaction product is increased from zero to 4 nm, and the plasma intensity is set to zero when a thickness of the reaction product is from 4 nm to 7 nm. Then, the plasma intensity is gradually increased from the plasma intensity corresponding to the oxide film thickness j 3 nm (or the high frequency power of 110 W supplied to the electrodes 36a, 36b) to the plasma intensity corresponding to the oxide film thickness j of 5.3 nm as a thickness of the reaction product is increased from 7 nm to 10 nm. By adjusting the plasma intensity in such a manner, a thin film having uniform film properties along the thickness direction can be obtained while the oxidization of the wafer W underneath the thin film (reaction product) is reduced. Even in this case, the plasma intensity may be set to zero at the initial stage of the film deposition step (or until a thickness of the reaction product becomes, for example, 1 nm).

As stated above, according to embodiments of the present invention, the plasma intensity may be adjusted as a thickness of the reaction product is increased, depending on desired properties of semiconductor devices. The adjustment of the plasma intensity may be made in order to make the properties of the thin film of the reaction product uniform or non-uniform along the thickness direction. For example, when the silicon oxide film is used as a gate oxide film, the flat boundary between the underlying film 91 and the silicon oxide film 94 can be obtained, so that carrier mobility in a channel of a field effect transistor can be increased. In addition, the first silicon oxide film 92 and the second silicon oxide film 93 of the silicon oxide film 94 (FIG. 22) can become low leakage, high reliability films by exposing the oxide films 92, 93 to the plasma having the plasma intensity sufficient to appropriately alter the oxide films 92, 93. Moreover, the upper silicon oxide film 93 of the silicon oxide film 94 may have a high density and a high gas barrier characteristic by increasing the plasma intensity. In such ways, the film properties along the thickness direction can be arbitrarily adjusted.

In the above embodiments, the film deposition step and the alteration step are alternately performed. Namely, supplying the silicon-containing gas and the $O_3$ gas and irradiating the plasma to the wafer W are performed while the turntable 2 is rotated. However, the alteration step may be performed every plural film deposition step. In this case, the high frequency power is not supplied to the electrodes 36a, 36b when the film deposition step is performed plural times, but supplied to the electrodes 36a, 36b only when the alteration step is performed. In addition, when the alteration step is performed, the silicon-containing gas and the $O_3$ gas are not supplied to the corresponding process areas P1, P2 (FIG. 3). In this case, the alteration step can be continuously performed plural times by rotating the turntable 2.

While the two parallel electrodes 36a, 36b are used in order to generate the plasma (so-called Capacitively Coupled Plasma (CCP)) in the above embodiments, a U-shaped electrode may be used. In this case, it is preferable when a curved portion of the U-shaped electrode is arranged near the center of the vacuum chamber 1 and two straight portions separately go through the outer circumferential wall of the chamber body 12 in an airtight manner. When high frequency power is supplied to the U-shaped electrode, so-called Inductively Coupled Plasma (ICP) is generated in the vacuum chamber 1. In addition, not only CCP and ICP but also Surface Wave Plasma (SWP) using microwaves and Electron Cyclotron Resonance (ECR) Plasma may be employed.

Moreover, the oxidizing gas may be supplied to the wafer W on which the silicon-containing gas is adsorbed, through the activated gas injector 220 rather than the second reaction gas nozzle 32. In this case, a process gas (Ar gas and $O_2$ gas) is supplied to and activated by the activated gas injector 220, so that the silicon-containing gas adsorbed on the wafer W is oxidized and so-formed silicon oxide is altered by the process gas from the activated gas injector 220.

Furthermore, while the high frequency power is adjusted in order to change the plasma intensity in the above embodiments, the inner pressure in the vacuum chamber 1 may be adjusted instead of or in addition to the high frequency power, as explained later. Additionally, $O_2$ gas or $O_3$ gas may be used as the oxidizing gas supplied from the second reaction gas nozzle 32, and Ar gas and $O_3$ gas may be used as a process gas for generating the plasma.

In addition, while the silicon-containing gas and the $O_3$ gas are used to form the silicon oxide film in the above embodiments, the silicon-containing gas and ammonia ($NH_3$) gas may be used as the first reaction gas and the second reaction gas, respectively, thereby forming a silicon nitride film. In this case, a mixed gas of Ar and ammonia or a mixed gas of Ar and nitrogen may be used as a process gas from which the plasma is generated. The film deposition step and the alteration step are alternately performed using these gases. Namely, when the plasma intensity is reduced or set to zero at the initial stage of the film deposition step and then increased as a thickness of the silicon nitride film is increased, the silicon nitride film having uniform density along the thickness direction while the upper surface of the wafer W is prevented from being nitrided. On the other hand, when the plasma intensity is so high that the plasma reaches the upper surface of the wafer W at the initial stage of the film deposition step, the upper surface of the wafer W is nitrided, and thus excellent flatness is achieved at the boundary between the silicon nitride film and the underlying layer.

In addition, titanium chloride ($TiCl_2$) gas and ammonia ($NH_3$) gas may be used as the first reaction gas and the second reaction gas, thereby forming titanium nitride (TiN) film. In this case, a substrate made of silicon is used as the wafer W, and Ar gas or nitrogen gas is used as a process gas from which the plasma is generated.

Figure 30:
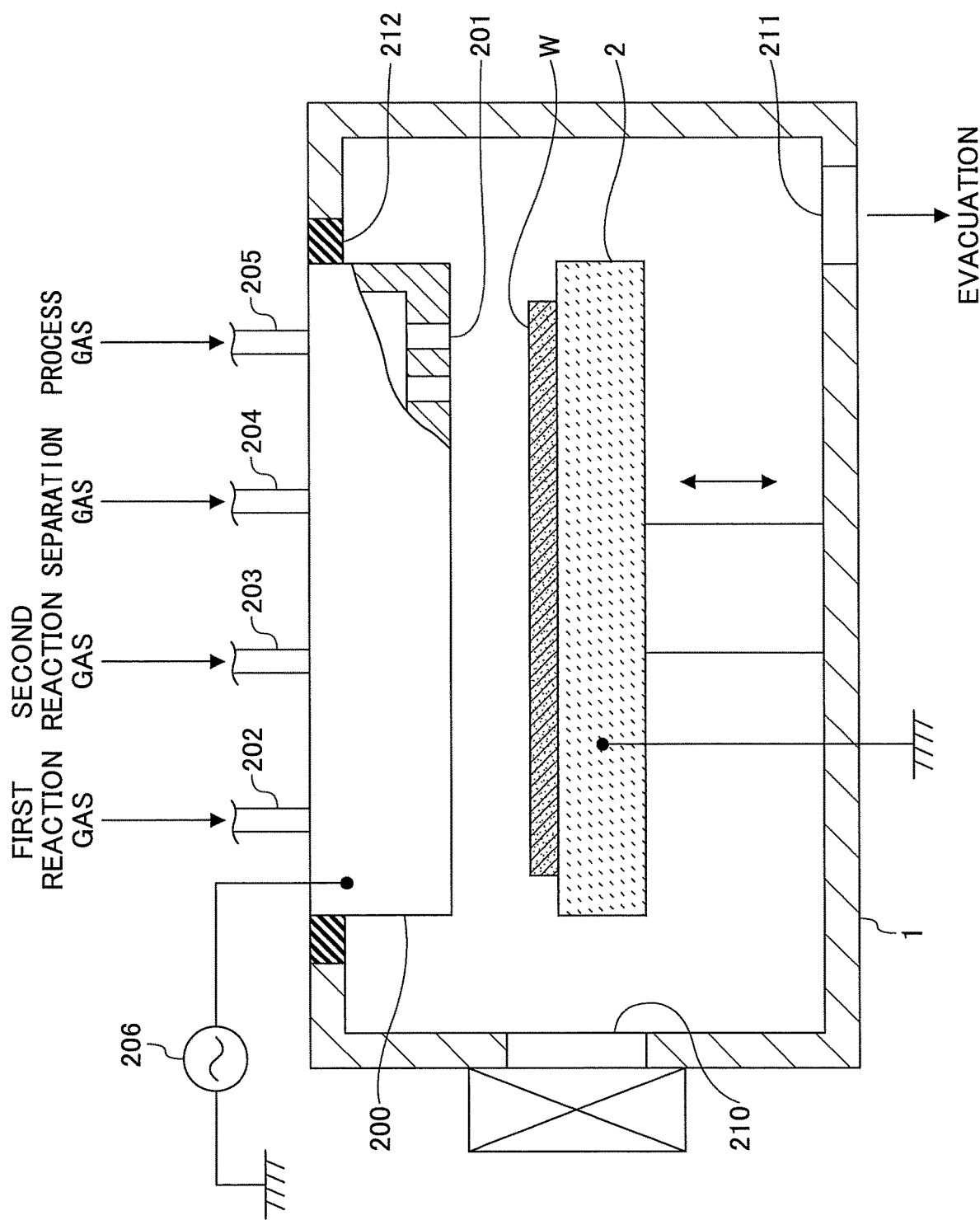
FIG. 30 is a cross-sectional view of another film deposition apparatus according to another example of the present invention.

In addition, the film deposition step and the alteration step may be performed in not only the film deposition apparatus (a so-called semi-batch apparatus) shown in FIG. 2 but also a single-wafer apparatus. As shown in FIG. 30, such a single-wafer apparatus is provided with, for example, a vacuum chamber 1, a susceptor 2 that is provided in the vacuum chamber 1 and on which the wafer W is placed, and a gas showerhead 200 arranged above the susceptor 2 in order to oppose the susceptor 2. The showerhead 200 has plural gas ejection holes 201 on the lower surface. In addition, gas supplying lines 202, 203, 204, and 205 are connected to corresponding gas conduits (not shown) formed in the showerhead 200. With this configuration, a first reaction gas, a second reaction gas, a separation gas (purge gas), and a process gas from which the plasma is generated are separately supplied toward the susceptor 2 from the corresponding gas ejection holes 201 through the corresponding gas supplying lines 202, 203, 204, and 205 and the corresponding gas conduits. In addition, a high frequency power source 206 is connected to the showerhead 200, so that the showerhead 200 serves as parallel planar electrodes together with the susceptor 2. Incidentally, a reference symbol 210 represents a transfer opening through which the wafer W is transferred into/out from the vacuum chamber 1; a reference symbol 211 represents an evacuation port; and a reference symbol 212 represents an insulating member.

When the film deposition step is performed in the single-wafer apparatus, the first reaction gas and the second reaction gas are alternately supplied to the vacuum chamber 1 with purging periods therebetween. In each of the purging periods, the purge gas is supplied to the vacuum chamber 1 while the vacuum chamber 1 is evacuated. When the alteration step is performed, after the vacuum chamber 1 is purged with the purge gas and evacuated to vacuum, the process gas from which the plasma is generated is supplied to the vacuum chamber 1, and the high frequency power is supplied across the showerhead 200 and the susceptor 2. In such a manner, the film deposition step and the alteration step are alternately performed with the purging periods therebetween.

Next, experiments carried out in order to study the influence of the plasma intensity in the alteration step and their results are explained.

Example 1

First, dependence of the plasma intensity of the plasma on the inner pressure in the vacuum chamber 1 and the high frequency power was studied. In this experiment, the batch type experimental apparatus was used. This apparatus is provided with a vacuum chamber, a susceptor inside the vacuum chamber, and an ICP type plasma source arranged to oppose the susceptor. Distance between the plasma source and the wafer W is set to 80 mm. After the wafer W was placed on the susceptor and the plasma was irradiated to the wafer W for 180 s, the oxide film thickness j of the silicon oxide film formed on the upper surface of the wafer W was measured. Such an experiment was carried out repeatedly, with different pressures of the vacuum chamber while the high frequency power was maintained at 200 W, and with different high frequency powers while the inner pressure in the vacuum chamber was maintained at 266 Pa (2 Torr).

Figure 31:
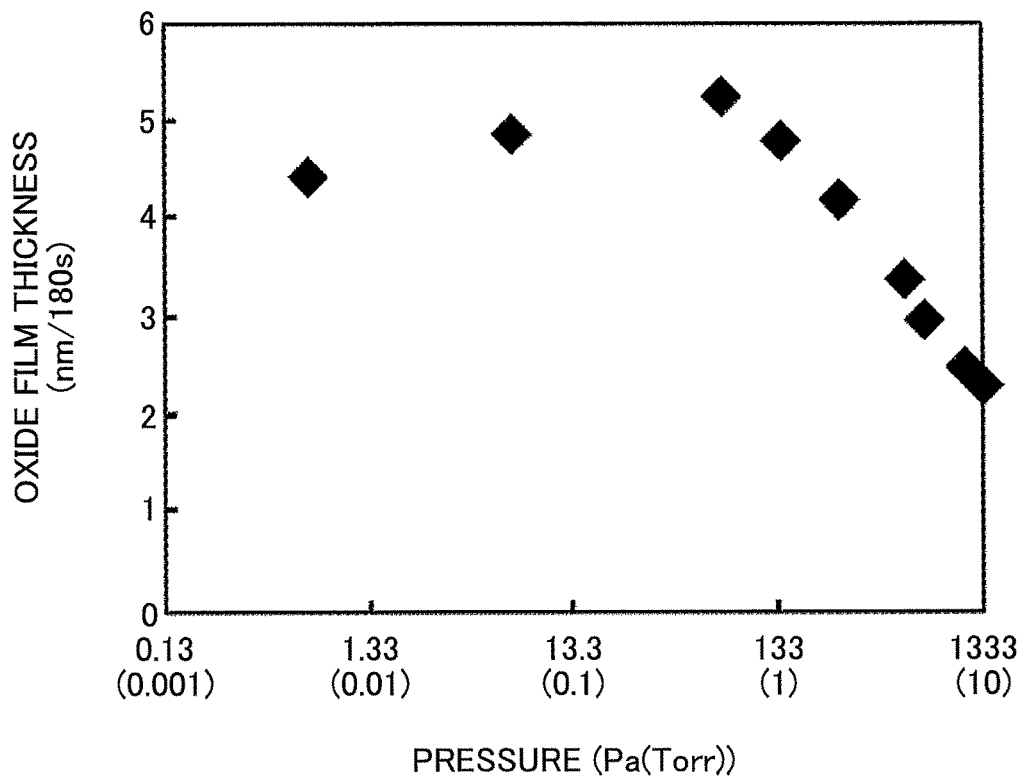
FIG. 31 is a graph illustrating a relationship between an oxide film thickness and an inner pressure in a vacuum chamber of the film deposition apparatus.
Figure 32:
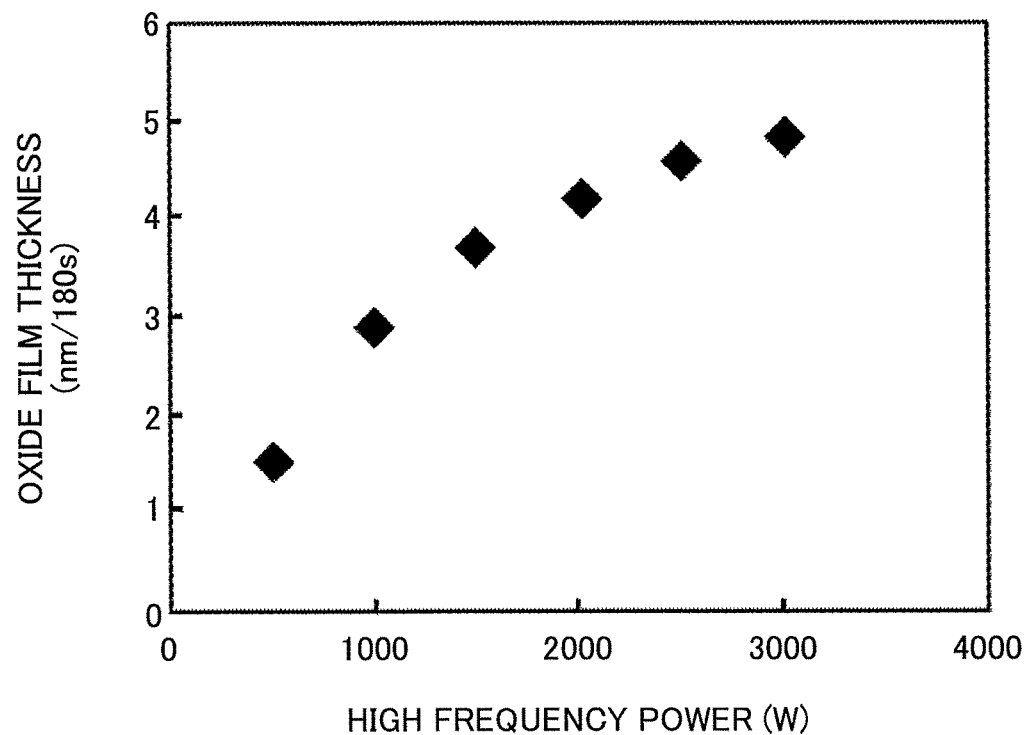
FIG. 32 is a graph illustrating a relationship between an oxide film thickness and high frequency power supplied to electrodes thereby to generate plasma.

As a result, it has been found that the plasma intensity can be adjusted by changing the inner pressure in the vacuum chamber, as shown in FIG. 31, and by changing the high frequency power, as shown in FIG. 32.

Example 2

Next, shrinkage rates of silicon oxide films are explained. The silicon oxide films used were formed on the wafers W by performing only the film deposition step without the alteration step. The shrinkage rates were calculated using thicknesses of the silicon oxide films before and after the alteration step was performed with respect to the silicon oxide films at various plasma intensities.

Figure 33:
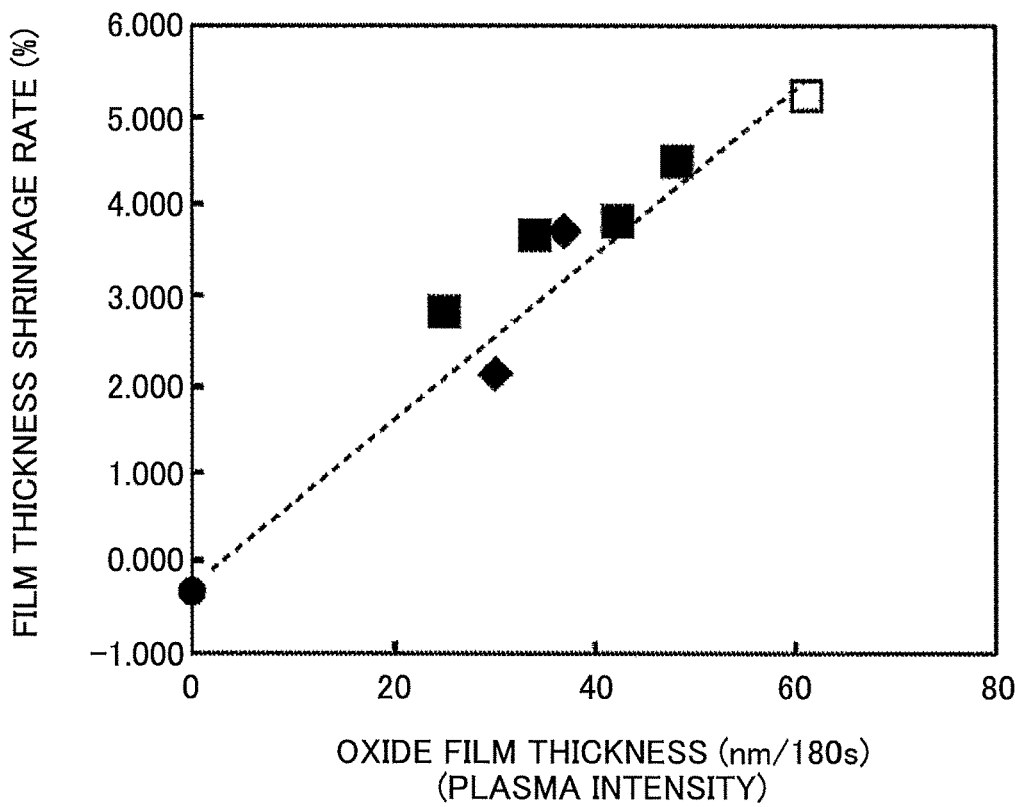
FIG. 33 is a graph illustrating a relationship between a film shrinkage and an oxide film thickness.

As a result, it has been found as shown in FIG. 33 that the shrinkage rate is in linear proportion with the plasma intensity. This result indicates that the film properties along the thickness direction can be adjusted by changing the plasma intensity.

Example 3

Next, oxidation of the silicon wafer W by the plasma including $O_2$ gas was studied. In this experiment, a bare silicon wafer with the clean upper surface (or with silicon exposed) and a test silicon wafer with a thermal silicon dioxide layer having a thickness of 10 nm were used. The upper surfaces of the bare silicon wafer and the test silicon wafer with the thermal silicon dioxide layer are exposed to the plasma for different periods of time while the turntable 2 is rotated in the film deposition apparatus explained with reference to FIGS. 2 through 8.

Figure 34:
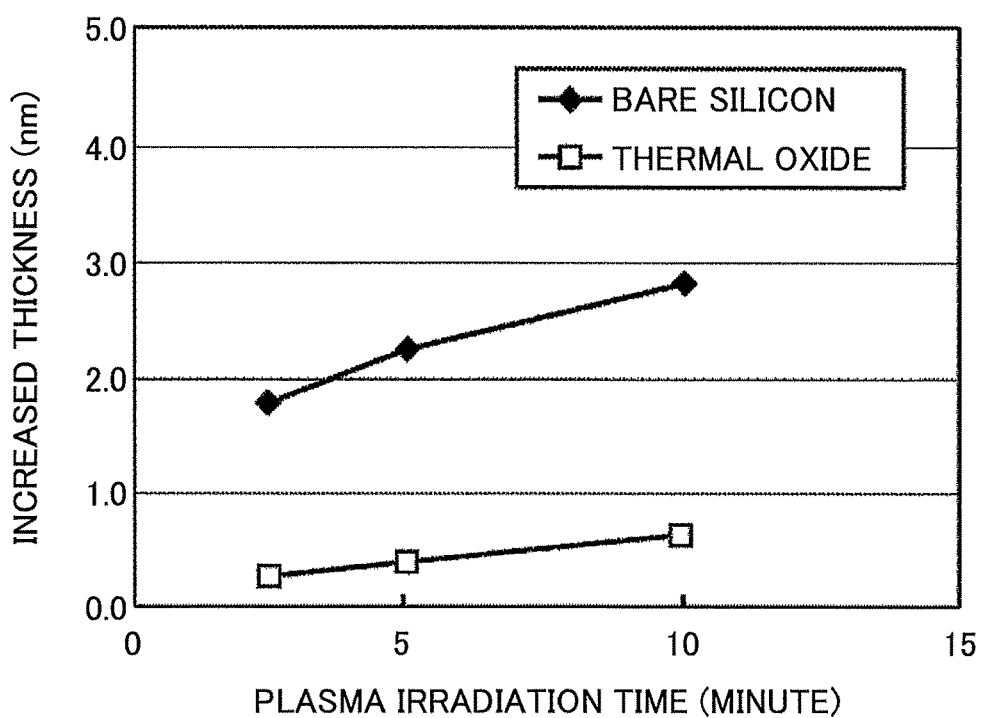
FIG. 34 is a graph illustrating a relationship between an increased film thickness and plasma irradiation time.

As a result, after the upper surface of the bare silicon wafer was exposed to the plasma for 10 minutes, a silicon oxide film having a thickness of 2.8 nm was formed thereon, as shown in FIG. 34. This result indicates that the silicon oxide can be formed with a controlled thickness by adjusting the plasma intensity as the thickness is increased, as explained with reference to FIGS. 21 and 22.

On the other hand, a silicon oxide film having a thickness of only 0.6 nm was formed on the thermal silicon dioxide layer on the test silicon wafer, after the test silicon wafer (the thermal silicon dioxide layer) was exposed to the plasma for 10 minutes. When the silicon oxide is formed through the irradiation of the plasma, the silicon oxide is grown through the plasma-oxidization of the upper surface of the silicon wafer. Therefore, when the thermal silicon dioxide is formed on the upper surface of the silicon wafer, the plasma cannot penetrate deep into the silicon wafer, and thus the silicon oxide film having a thickness of only 0.6 nm was obtained. In addition, this result indicates that the plasma can penetrate into the silicon wafer even when the thermal silicon dioxide layer is formed on the test silicon wafer. Therefore, it has been confirmed that the plasma can oxidize the upper surface of the wafer W through the silicon oxide film deposited in the film deposition step, while altering the properties of the deposited silicon oxide film.

While the present invention has been described in reference to the foregoing embodiments, the present invention is not limited to the disclosed embodiments, but may be modified or altered within the scope of the accompanying claims.

What is claimed is:

1. A film deposition method that forms a thin film on a substrate by repeating a cycle of alternately supplying plural kinds of reaction gases to the substrate under vacuum, wherein a first reaction gas among the plural kinds of the reaction gases reacts with a second reaction gas among the plural kinds of the reaction gases, the second reaction gas being adsorbed on the substrate, to produce a reaction product, the film deposition method comprising steps of:
    placing a substrate in a substrate receiving area of a susceptor provided in a vacuum chamber;
    evacuating the vacuum chamber;
    alternately supplying plural kinds of the reaction gases to the substrate in the substrate receiving area from corresponding nozzles to form a thin film on the substrate;
    supplying plasma including a chemical component that reacts with the second reaction gas adsorbed on the substrate from sheath pipes and electrodes to the substrate when the thin film is being formed, to alter the thin film on the substrate;
    keeping plasma intensity of the plasma supplied to the substrate at zero until a thickness of the thin film reaches 1 nm; and
    changing the plasma intensity of the plasma supplied to the substrate after the thickness of the thin film reaches 1 nm so as to increase the plasma intensity from a plasma intensity corresponding to the oxide film thickness of 1.5 nm to a plasma intensity corresponding to the oxide film thickness of 2 nm as a thickness of the reaction product is increased from 1 to 4 nm, keeping the plasma intensity zero when a thickness of the thin film is from 4 nm to 7 nm, and increasing the plasma intensity from a plasma intensity corresponding to the oxide film thickness of 3 nm to a plasma intensity corresponding to 5.3 nm as a thickness of the reaction product is increased from 7 nm to 10 nm, wherein the film deposition method further includes pre-determining a plasma intensity corresponding to an oxide film thickness of n nm by measuring at least one of the power supplied to an electrode pair, the inner pressure of the vacuum chamber, the exposure time of the plasma to the wafer, and the distance between the electrode pair that is required to generate the oxide film thickness of n nm by irradiating the plasma for 180 seconds.

2. The film deposition method of claim 1, wherein the first reaction gas serves as an oxidizing or nitriding gas with respect to the second reaction gas adsorbed on the substrate, and wherein the thin film is formed of one of metal oxide, silicon oxide metal nitride, and silicon nitride.

3. The film deposition apparatus of claim 2, wherein an underlying film of the thin film to be formed thereon includes metal or silicon.

4. The film deposition method of claim 1, wherein the plasma intensity is changed by adjusting an inner pressure in the vacuum chamber.

5. The film deposition method of claim 1, wherein the susceptor is rotated around a vertical axis with respect to the plural nozzles arranged at predetermined intervals along a rotation direction of the susceptor so that the substrate receiving area of the susceptor passes alternately through areas to which the plural nozzles supply the corresponding reaction gases in the forming of the thin film, wherein the plasma generated is supplied to the substrate in one of a first area to which the first reaction gas is supplied and a second area located downstream relative to the first area along a rotation direction of the susceptor in the altering of the thin film, and the film deposition method further comprising supplying a separation gas to separation areas that are located between the areas to which the plural nozzles supply the corresponding reaction gases in order to separate the areas.

6. A film deposition method that forms a thin film on a substrate by repeating a cycle of alternately supplying plural kinds of reaction gases to the substrate under vacuum, wherein a first reaction gas among the plural kinds of the reaction gases reacts with a second reaction gas among the plural kinds of the reaction gases, the second reaction gas being adsorbed on the substrate, to produce a reaction product, the film deposition method comprising steps of:

placing a substrate in a substrate receiving area of a susceptor provided in a vacuum chamber;

evacuating the vacuum chamber;

supplying the plural kinds of the reaction gases from corresponding nozzles toward the susceptor;

supplying plasma including a chemical component that reacts with one of the second reaction gas adsorbed on the substrate and at least a part of the substrate from sheath pipes and electrodes toward the susceptor; and rotating the susceptor around a vertical axis so that the substrate receiving area passes alternately through a supplying area to which the second reaction gas is supplied, a reaction area where the first reaction gas reacts with the second reaction gas adsorbed on the substrate, and a plasma area that is arranged downstream relative to the reaction area along a rotation direction of the susceptor and where the plasma is supplied, wherein the supplying area, the reaction area, and the plasma area are arranged at intervals along a circumferential direction of the vacuum chamber, wherein the method further comprises:

keeping plasma intensity of the plasma supplied to the substrate at zero until a thickness of the thin film reaches 1 nm; and changing the plasma intensity of the plasma supplied to the substrate after the thickness of the thin film reaches 1 nm so as to increase the plasma intensity from a plasma intensity corresponding to the oxide film thickness of 1.5 nm to a plasma intensity corresponding to the oxide film thickness of 2 nm as a thickness of the reaction product is increased from 1 to 4 nm, keeping the plasma intensity zero when a thickness of the thin film is from 4 nm to 7 nm, and increasing the plasma intensity from a plasma intensity corresponding to the oxide film thickness of 3 nm to a plasma intensity corresponding to 5.3 nm as a thickness of the reaction product is increased from 7 nm to 10 nm, wherein the film deposition method further includes pre-determining a plasma intensity corresponding to an oxide film thickness of n nm by measuring at least one of the power supplied to an electrode pair, the inner pressure of the vacuum chamber, the exposure time of the plasma to the wafer, and the distance between the electrode pair that is required to generate the oxide film thickness of n nm by irradiating the plasma for 180 seconds.

7. A computer readable storage medium that stores a computer program to be used in a film deposition apparatus that forms a thin film on a substrate by repeating a cycle of alternately supplying plural kinds of reaction gases to the substrate, the computer program including groups of instructions that cause the film deposition apparatus to perform the film deposition method of claim 1.

* * * * *